US012660182B2

(12) United States Patent
Yang et al.

(10) Patent No.: US 12,660,182 B2
(45) Date of Patent: Jun. 16, 2026

(54) METHOD OF MANUFACTURING SEMICONDUCTOR DEVICES AND SEMICONDUCTOR DEVICES

(71) Applicant: SAMSUNG ELECTRONICS CO., LTD., Suwon-si (KR)

(72) Inventors: Siyeong Yang, Suwon-si (KR); Yuyeon Kim, Yongin-si (KR); Woosung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 677 days.

(21) Appl. No.: 18/072,276

(22) Filed: Nov. 30, 2022

(65) Prior Publication Data

US 2023/0292509 A1     Sep. 14, 2023

(30) Foreign Application Priority Data

Mar. 11, 2022     (KR) ........................ 10-2022-0030535

(51) Int. Cl.
H10B 43/27          (2023.01)
H10B 41/10          (2023.01)
(Continued)

(52) U.S. Cl.
CPC ............. H10B 43/27 (2023.02); H10B 41/10 (2023.02); H10B 41/27 (2023.02); H10B 41/35 (2023.02);
(Continued)

(58) Field of Classification Search
CPC ........ H10B 43/27; H10B 41/10; H10B 43/35; H10B 41/35; H10B 43/10; H10B 41/27; H01L 23/5283
See application file for complete search history.

(56) References Cited

U.S. PATENT DOCUMENTS 9,318,329 B2     4/2016  Kohji et al.
9,627,395 B2     4/2017  Zhang et al.
(Continued)

FOREIGN PATENT DOCUMENTS

KR     10-2005-0049684 A     5/2005
KR     2002-0027775 A       4/2022

*Primary Examiner* — Jacob Y Choi
*Assistant Examiner* — Neil R Prasad
(74) *Attorney, Agent, or Firm* — Sughrue Mion, PLLC

(57)          ABSTRACT

A method of manufacturing a semiconductor device includes forming a molded structure by stacking interlayer insulating layers alternately with sacrificial layers on a plate layer, forming channel holes passing through the molded structure, forming channel layers doped with non-conductive impurities in the channel holes, forming a metal layer above the channel holes, forming metal silicide layers on upper ends of the channel layers using the metal layer, crystallizing the channel layers using the metal silicide layers by performing a heat treatment process at a temperature of 800 degrees or more, forming openings penetrating through the molded structure and extending in one direction, removing the sacrificial layers exposed through the openings, and forming gate electrodes, by filling regions from which the sacrificial layers have been removed, with a conductive material. After the crystallizing, the metal silicide layers are located lower than a lowermost gate electrode among the gate electrodes.

19 Claims, 22 Drawing Sheets

(51) Int. Cl.

| | | |
|---|---|---|
| *H10B 41/27* | (2023.01) | |
| *H10B 41/35* | (2023.01) | |
| *H10B 43/10* | (2023.01) | |
| *H10B 43/35* | (2023.01) | |
| *H10W 20/41* | (2026.01) | |

(52) U.S. Cl.

CPC ............. *H10B 43/10* (2023.02); *H10B 43/35* (2023.02); *H10W 20/435* (2026.01)

(56) References Cited

U.S. PATENT DOCUMENTS

| | | | |
|---|---|---|---|
| 10,453,707 B2 | 10/2019 | Cho et al. | |
| 10,658,295 B2 | 5/2020 | Kawai et al. | |
| 2005/0110022 A1 | 5/2005 | Kim et al. | |
| 2008/0217620 A1* | 9/2008 | Park | H10D 86/00 |
| | | | 257/E33.001 |
| 2016/0268274 A1* | 9/2016 | Kawai | H10B 43/27 |
| 2018/0315621 A1* | 11/2018 | Cho | H01L 21/76877 |
| 2021/0242241 A1* | 8/2021 | Rajashekhar | H10B 41/10 |
| 2021/0272809 A1 | 9/2021 | Matsubara | |
| 2021/0343714 A1 | 11/2021 | Gardner et al. | |
| 2022/0045091 A1* | 2/2022 | Cui | H01L 21/32135 |

* cited by examiner

1

METHOD OF MANUFACTURING SEMICONDUCTOR DEVICES AND SEMICONDUCTOR DEVICES

CROSS-REFERENCE TO RELATED APPLICATION

This application claims priority to Korean Patent Application No. 10-2022-0030535, filed on Mar. 11, 2022, in the Korean Intellectual Property Office, the disclosure of which is incorporated by reference herein in its entirety.

BACKGROUND

The disclosure relates to a method of manufacturing a semiconductor device and to a semiconductor device.

In a data storage system, a semiconductor device capable of storing high-capacity data is in demand. Accordingly, a method for increasing the data storage capacity of a semiconductor device is being studied. For example, as a method for increasing the data storage capacity of a semiconductor device, a semiconductor device including memory cells arranged three-dimensionally instead of two-dimensionally has been proposed.

SUMMARY

Example embodiments provide a method of manufacturing a semiconductor device, to manufacture a semiconductor device having improved reliability, and a semiconductor device manufactured by the method.

In accordance with an aspect of the disclosure, A method of manufacturing a semiconductor device includes forming a molded structure by stacking interlayer insulating layers alternately with sacrificial layers on a plate layer; forming channel holes passing through the molded structure; forming channel layers doped with non-conductive impurities in the channel holes; forming a metal layer covering the channel holes; forming metal silicide layers on upper ends of the channel layers using the metal layer; crystallizing the channel layers using the metal silicide layers by performing a heat treatment process at a temperature of 800 degrees Celsius or more; forming openings penetrating through the molded structure and extending in one direction; removing the sacrificial layers exposed through the openings; and forming gate electrodes, by filling regions from which the sacrificial layers have been removed, with a conductive material, wherein after the crystallizing, the metal silicide layers are located lower than a lowermost gate electrode among the gate electrodes.

In accordance with an aspect of the disclosure, a method of manufacturing a semiconductor device includes forming a molded structure by stacking interlayer insulating layers alternately with sacrificial layers on a plate layer; forming channel holes passing through the molded structure; forming channel layers in the channel holes; forming metal silicide layers on upper ends of the channel layers; crystallizing the channel layers by metal induced lateral crystallization (MILC) using the metal silicide layers; forming openings penetrating through the molded structure and extending in one direction; removing the sacrificial layers exposed through the openings; and forming gate electrodes by filling regions from which the sacrificial layers have been removed with a conductive material, wherein the forming of the channel layers includes supplying a doping source gas, the doping source gas including a semiconductor source gas and non-conductive impurities.

In accordance with an aspect of the disclosure, a method of manufacturing a semiconductor device includes forming a molded structure by stacking interlayer insulating layers alternately with sacrificial layers on a plate layer; forming channel holes passing through the molded structure; forming first regions of channel structures comprising channel layers in the channel holes; forming a metal layer covering the channel structures; forming metal silicide layers on upper ends of the channel layers using the metal layer; crystallizing the channel layers using the metal silicide layers; forming second regions of the channel structures in the channel holes; forming openings penetrating through the molded structure and extending in one direction; and removing the sacrificial layers exposed through the openings and forming gate electrodes, wherein the forming of the first regions of the channel structures includes forming channel dielectric layers on inner sidewalls of the channel holes; forming the channel layers comprising a semiconductor material doped with non-conductive impurities, on the channel dielectric layers; and forming a channel filling layer inside the channel layers, and wherein the forming of the second regions of the channel structures includes forming channel pads, each channel pad including a semiconductor material doped with conductive impurities on upper ends of the channel holes.

According to example embodiments, a semiconductor device includes a substrate, gate electrodes spaced apart from each other and stacked in a first direction, perpendicular to an upper surface of the substrate, a channel structure extending vertically by penetrating through the gate electrodes and including a channel layer, and a metal silicide layer positioned on a level lower than a lower surface of a lowermost gate electrode among the gate electrodes, in the channel layer. The channel layer includes non-conductive impurities in a concentration ranging from about $5\times10^{20}/cm^3$ to about $5\times10^{21}/cm^3$.

BRIEF DESCRIPTION OF DRAWINGS

The above and other aspects, features, and advantages of certain embodiments of the disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
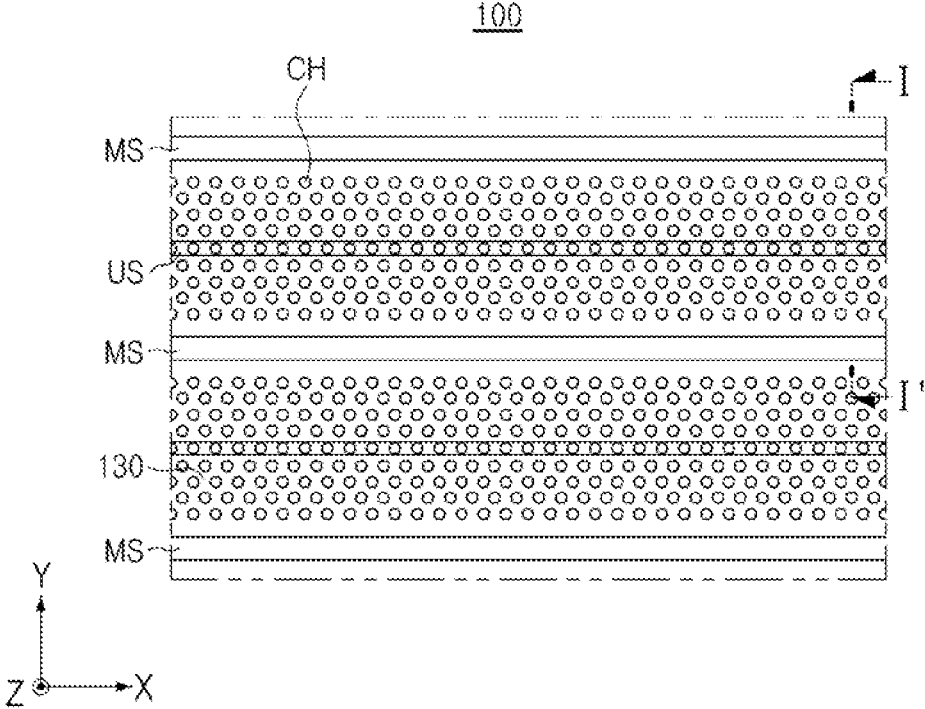
FIG. 1 is a schematic plan view of a semiconductor device according to example embodiments.

FIG. 1 is a schematic plan view of a semiconductor device according to example embodiments.

Figure 2:
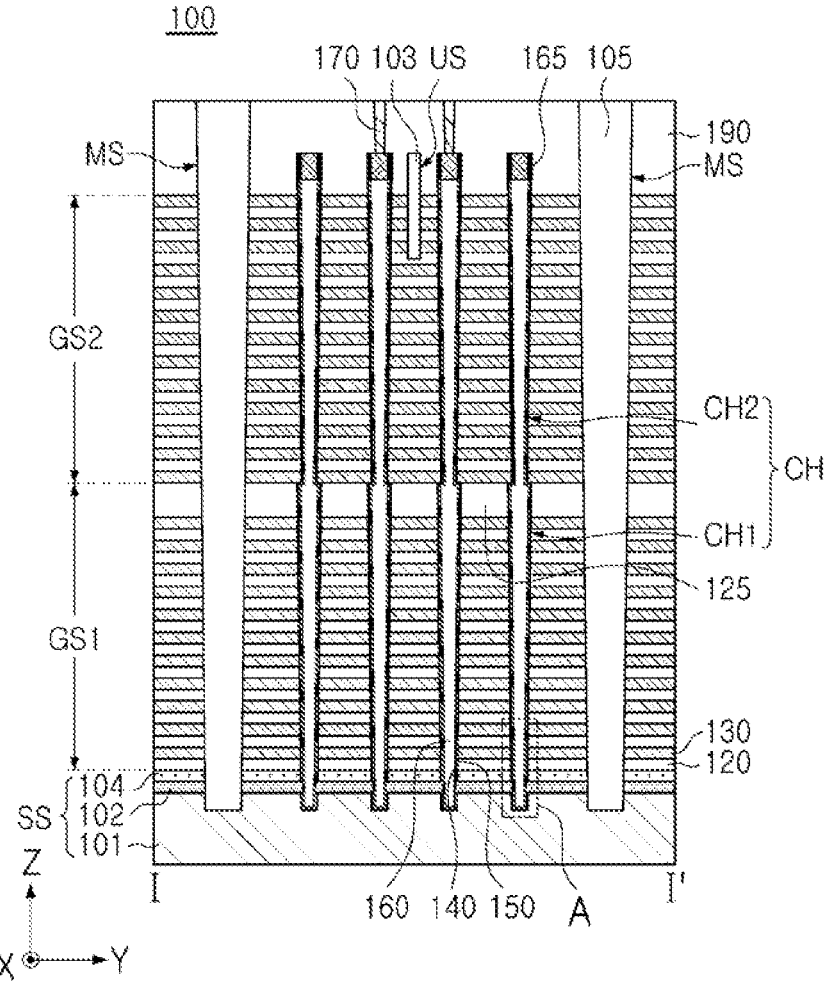
FIG. 2 is a schematic cross-sectional view of a semiconductor device according to example embodiments.

FIG. 2 is a schematic cross-sectional view of a semiconductor device according to example embodiments. FIG. 2 is a cross-sectional view taken along line I-I' of FIG. 1.

Figure 3:
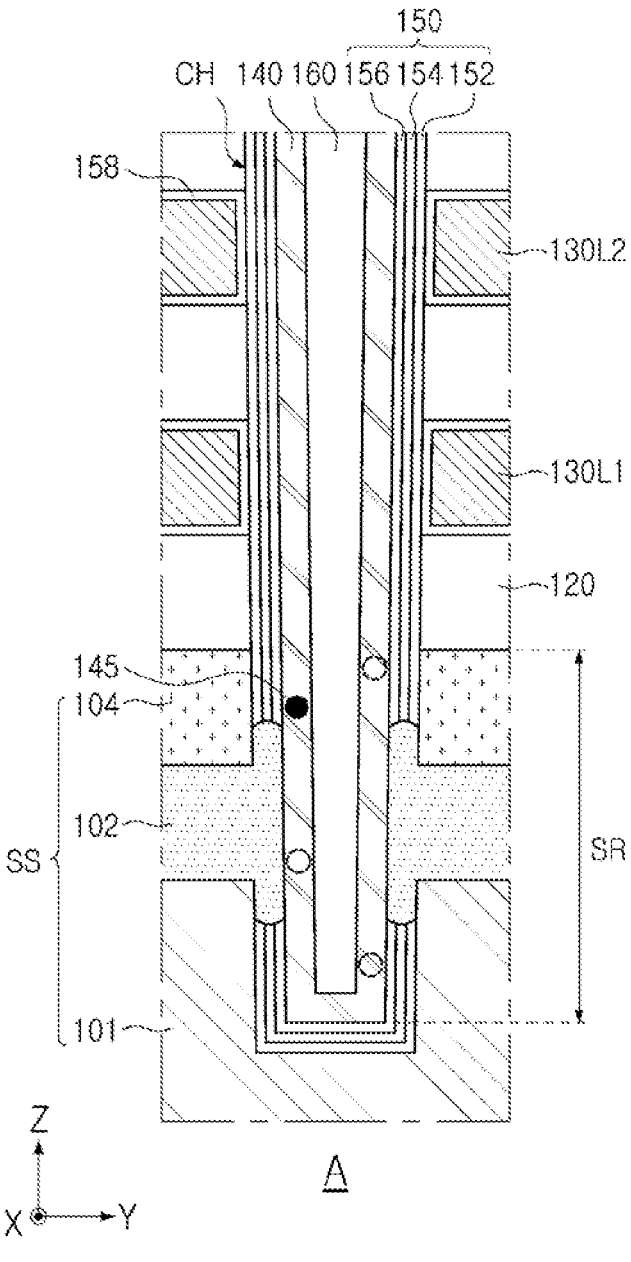
FIG. 3 is a partially enlarged view of a semiconductor device according to example embodiments.

FIG. 3 is a partially enlarged view of a semiconductor device according to example embodiments. FIG. 3 illustrates an enlarged area 'A' of FIG. 2.

Referring to FIGS. 1 to 3, a semiconductor device 100 may include a source structure SS including a plate layer 101 and first and second horizontal conductive layers 102 and 104 (e.g., a lower conductive layer and an upper conductive layer) on the plate layer 101, gate electrodes 130 stacked on the plate layer 101, interlayer insulating layers 120 alternately stacked with the gate electrodes 130 on the plate layer 101, channel structures CH disposed to penetrate through the first and second stack structures GS1 and GS2 of the gate electrodes 130 and respectively including a channel layer 140 and a metal silicide layer 145, upper isolation regions US penetrating through a portion of the second stack structure GS2, separation regions MS extending by penetrating through the first and second stack structures GS1 and GS2, contact plugs 170 on the channel structures CH, and a cell region insulating layer 190 covering the gate electrodes 130 and the channel structures CH.

In the semiconductor device 100, one memory cell string may be configured with each channel structure CH as a center, and a plurality of memory cell strings may be arranged in columns and rows in the X-direction and the Y-direction.

The plate layer 101 may have an upper surface extending in the X-direction and the Y-direction. The plate layer 101 may include a semiconductor material, for example, a group IV semiconductor, a group III-V compound semiconductor, or a group II-VI compound semiconductor. For example, the group IV semiconductor may include silicon, germanium, or silicon-germanium. The plate layer 101 may be provided as a bulk wafer, an epitaxial layer, a silicon on insulator (SOI) layer, a semiconductor on insulator (SeOI) layer, or the like.

The first and second horizontal conductive layers 102 and 104 may be stacked on the upper surface of the plate layer 101. The first and second horizontal conductive layers 102 and 104 are source layers and may form a source structure SS together with the plate layer 101. The source structure SS may function as a common source line of the semiconductor device 100. As illustrated in the enlarged view of FIG. 3, the first horizontal conductive layer 102 may be directly connected to the channel layer 140 around the channel layer 140. The first horizontal conductive layer 102 may partially extend in the Z-direction along the channel layer 140 to contact the channel layer 140.

The first and second horizontal conductive layers 102 and 104 may include a semiconductor material, such as polycrystalline silicon. In this case, at least the first horizontal conductive layer 102 may be a layer doped with impurities of the same conductivity type as a conductivity type of the plate layer 101. The second horizontal conductive layer 104 may be a doped layer or may be a layer including impurities diffused from the first horizontal conductive layer 102 while being an intrinsic semiconductor layer. However, the material of the second horizontal conductive layer 104 is not limited to the semiconductor material, and may be replaced with an insulating layer according to example embodiments. In example embodiments, a relatively thin insulating layer may be interposed between the upper surface of the first horizontal conductive layer 102 and the lower surface of the second horizontal conductive layer 104, and the thin insulating layer may be a portion of a horizontal sacrificial layer 110 (refer to FIG. 9) that remains without being removed during the process of manufacturing the semiconductor device 100.

The gate electrodes 130 may be vertically spaced apart and stacked on the plate layer 101 to form the first and second stack structures GS1 and GS2. The gate electrodes 130 may include a lower gate electrode forming a gate of the ground select transistor, memory gate electrodes forming a plurality of memory cells, and upper gate electrodes forming the gates of the string select transistors. The number of the memory gate electrodes constituting the memory cells may be determined according to the capacity of the semiconductor device 100. According to an example embodiment, the number of each of the upper and lower gate electrodes may be one or two or more, and may have the same structure as or different structure from the memory gate electrodes. In example embodiments, the gate electrodes 130 may further include a gate electrode 130 constituting an erase transistor disposed on the upper gate electrodes and/or below the lower gate electrode and used for an erase operation using a gate induced drain leakage (GIDL) phenomenon. Also, some gate electrodes 130, for example, gate electrodes adjacent to the upper or lower gate electrode, may be dummy gate electrodes.

The gate electrodes 130 may include a metal material, for example, tungsten (W). In some embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or combinations thereof.

The interlayer insulating layers 120 may be disposed between the gate electrodes 130. Like the gate electrodes 130, the interlayer insulating layers 120 may be disposed to be spaced apart from each other in a direction perpendicular to the upper surface of the plate layer 101. The interlayer insulating layers 120 may include an insulating material such as silicon oxide or silicon nitride.

The channel structures CH respectively constitute one memory cell string, and may be disposed to be spaced apart from each other while forming rows and columns on the plate layer 101. The channel structures CH may be disposed to form a grid pattern in an X-Y plane or may be disposed in a zigzag shape in one direction (see, e.g., FIG. 1). The channel structures CH may have a columnar shape filling the channel hole, and may have inclined side surfaces that become narrower as they get closer to the plate layer 101 according to an aspect ratio. As illustrated in FIG. 3, each of the channel structures CH may further include a channel dielectric layer 150 on the outer surface of the channel layer 140, a channel filling insulating layer 160 inside the channel layer 140, and an uppermost channel pad 165 (see, e.g., FIG. 2), in addition to the channel layer 140 and the metal silicide layer 145.

The channel layer 140 may be formed in an annular shape surrounding the channel filling insulating layer 160 therein. However, in some embodiments, the channel filling insulating layer 160 may be omitted, and the channel layer 140 may have a columnar shape such as a cylinder filling the inside of the channel hole. The channel layer 140 may include a semiconductor material such as silicon, and may include non-conductive impurities doped into the semiconductor material. The non-conductive impurities may include at least one of oxygen (O), carbon (C), and nitrogen (N). The non-conductive impurities are intentionally doped into the channel layer 140, and may have a relatively high concentration compared to the case of impurities diffused from surrounding components or layers. For example, in the channel layer 140, the non-conductive impurities may have a concentration in the range of about $5 \times 10^{20}/cm^3$ to about $5 \times 10^{21}/cm^3$. By including the non-conductive impurities, solid phase crystallization of the channel layer 140 may be suppressed or delayed during a manufacturing process. If the concentration of the impurities is higher than the above range, the electrical characteristics of the semiconductor device 100 may be deteriorated due to the decrease in crystallinity of the channel layer 140, and if the concentration is lower than the above range, the solid-phase crystallization delay effect may not be sufficient.

The channel layer 140 may be a layer that is not doped with conductivity-type impurities such as p-type or N-type impurities during a manufacturing process. For example, the channel layer 140 may be a layer that is not intentionally doped with conductive impurities. However, in some embodiments, the channel layer 140 may further include N-type impurities diffused from the channel pad 165 and the source structure SS in an upper region and/or a lower region. For example, when the gate electrodes 130 include an erase gate electrode constituting an erase transistor, N-type impurities may be further included in a region parallel to the erase gate electrode.

Although the channel layer 140 is formed of the same material, the degrees of crystallization may be different in a first region on the metal silicide layer 145 and a second region below the metal silicide layer 145. The channel layer 140 may have a single crystal structure in the first region and a polycrystalline structure in the second region. For example, the second region may be formed of polycrystalline silicon including a plurality of crystal grains. In contrast, the first region may have a single crystal structure including one crystal grain or a single crystal-like structure. The "single crystal-like structure" indicates a structure in which about 98% or more is single crystal. Accordingly, the size of grains in the second region may be smaller than the size of grains in the first region.

The first region may have a single crystal structure or a single crystal-like structure since metal induced lateral crystallization (MILC) is performed by the metal silicide layer 145. The second region may have a polycrystalline structure by being crystallized by high temperature rather than being crystallized by MILC. However, in some embodiments, a portion of the upper portion of the second region, in contact with the metal silicide layer 145, may have a single crystal structure.

The metal silicide layer 145 may be positioned in the channel layer 140 to contact the channel layer 140. The metal silicide layer 145 may be formed as a metal silicide layer that is formed on the upper end of the channel layer 140 is diffused or moved down along the channel layer 140 and collected or captured, during the process of manufacturing the semiconductor device 100. The metal silicide layer 145 may be positioned at least at a level lower than the lower surface of the lowermost first gate electrode 130L1. In some embodiments, when the first gate electrode 130L1 is a dummy gate electrode, the metal silicide layer 145 may be located at least on a level lower than the lower surface of the second gate electrode 130L2 that is on the first gate electrode 130L1. For example, as illustrated in FIG. 3, the metal silicide layer 145 may be located in a fixed region SR including the lower end of the channel layer 140. The fixed region SR may be a region corresponding to a level from the lower surface of the channel layer 140 to the upper surface of the second horizontal conductive layer 104. The metal silicide layer 145 may be positioned at a level lower than the upper surface of the second horizontal conductive layer 104.

In an embodiment, in the channel structures CH, one metal silicide layer 145 may be positioned in each of the channel structures CH. The metal silicide layer 145 may be positioned at different levels in different channel structures CH. For example, in FIG. 3, various points at which the metal silicide layer 145 may be positioned in different channel structures CH is illustrated by a dotted circle. However, in some embodiments, a plurality of metal silicide layers 145 may also be located in one channel layer 140 in at least one of the channel structures CH.

The metal silicide layer 145 may have, for example, a disk shape, a spherical shape, or a similar shape. A length of the metal silicide layer 145 in one direction may be in a range of, for example, a size of about 10 nm or less, in detail, in a range of about 0.1 nm to about 10 nm. However, in example embodiments, the shape and size of the metal silicide layer 145 may be variously changed.

The metal silicide layer 145 may include a semiconductor element and a metal element. The metal silicide layer 145 may include, for example, nickel silicide ($NiSi_2$), titanium silicide ($TiSi_2$), cobalt silicide ($CoSi_2$), tungsten silicide ($WSi_2$), platinum silicide ($PtSi_2$), palladium silicide ($PdSi_2$), or other metal silicide, and in this case, may include germanium (Ge) or silicon germanium (SiGe) instead of silicon (Si). The metal silicide layer 145 may be nickel silicide represented by, for example, $NiS_2$.

In an embodiment, the channel layer 140 may be crystallized by the MILC method using the metal silicide layer 145, and during this process, solid-phase crystallization of the channel layer 140 by non-conductive impurities instead of by the MILC method in the channel layer 140 may be suppressed. Accordingly, the metal silicide layer 145 may easily move to the lower end of the channel layer 140 along the non-crystallized channel layer 140. Accordingly, the channel layer 140 may have a single crystal structure in most regions, and thus, electrical characteristics of the semiconductor device 100 may be secured. In addition, since the metal silicide layer 145 is fixed to the lower end of the channel layer 140, the reliability of the semiconductor device 100 may be prevented from deteriorating, compared to the case in which the metal silicide layer 145 is fixed adjacent to the gate electrode 130.

The channel dielectric layer 150 may be disposed between the gate electrodes 130 and the channel layer 140. The channel dielectric layer 150 may be disposed to cover the inner side surface and the bottom surface of the channel hole in which the channel structure CH is disposed. The channel dielectric layer 150 may include a blocking layer 152, a charge storage layer 154, and a tunneling layer 156 sequentially stacked from the gate electrodes 130. The semiconductor device 100 may further include a horizontal blocking layer 158, and the horizontal blocking layer 158 may extend in a horizontal direction along the gate electrodes 130. In some embodiments, the horizontal blocking layer 158 may be omitted.

The blocking layer 152 and the horizontal blocking layer 158 may include silicon oxide ($SiO_2$), silicon nitride ($Si_3N_4$), silicon oxynitride (SiON), a high-k dielectric material, or combinations thereof. The charge storage layer 154 may be a charge trap layer or a floating gate conductive layer. The tunneling layer 156 may tunnel charge into the charge storage layer 154 and may include, for example, silicon oxide ($SiO_2$), silicon nitride ($Si_3N_4$), silicon oxynitride (SiON), or combinations thereof.

The channel filling insulating layer 160 may be disposed to fill the channel hole in the channel layer 140. The channel filling insulating layer 160 may include an insulating material, for example, silicon oxide ($SiO_2$), silicon nitride ($Si_3N_4$), silicon oxynitride (SiON), or combinations thereof.

The channel pad 165 may be disposed on the upper end of the channel layer 140 in the channel structure CH. The channel pad 165 may be physically and electrically connected to the channel layer 140. The channel pad 165 may include, for example, doped polycrystalline silicon or doped monocrystalline silicon.

The channel layer 140, the channel dielectric layer 150, and the channel filling insulating layer 160 may be connected to each other between the first channel structure CH1 and the second channel structure CH2. An intermediate interlayer insulating layer 125 having a relatively thick thickness may be further disposed between the first channel structure CH1 and the second channel structure CH2. However, the shapes of the interlayer insulating layers 120 and the intermediate interlayer insulating layer 125 may be variously changed in example embodiments.

The upper isolation regions US may extend in the X-direction, between the separation regions MS adjacent in the Y-direction. The upper separation regions US may be disposed to pass through portions of the gate electrodes 130 including the uppermost upper gate electrode among the gate electrodes 130. As illustrated in FIG. 2, the upper separation regions US may separate, for example, a total of three gate electrodes 130 from each other in the Y-direction. However, the number of gate electrodes 130 divided by the upper separation regions US may be variously changed in some embodiments. The upper separation regions US may include an upper isolation insulating layer 103. The upper isolation insulating layer 103 may include an insulating material, for example, silicon oxide, silicon nitride, or silicon oxynitride.

The separation regions MS extend in the X-direction by penetrating through the gate electrodes 130, the interlayer insulating layers 120, and the first and second horizontal conductive layers 102 and 104, and may be connected to the plate layer 101. As illustrated in FIG. 1, the separation regions MS may be disposed parallel to each other. The separation regions MS may separate the gate electrodes 130 from each other in the Y-direction. The separation regions MS may have a shape in which a width decreases toward the plate layer 101 due to a high aspect ratio. The separation regions MS may include an isolation insulating layer 105 disposed in the trench. The isolation insulating layer 105 may include an insulating material, for example, silicon oxide, silicon nitride, or silicon oxynitride.

The contact plugs 170 may be disposed on the channel structures CH. The contact plugs 170 may have a cylindrical shape, and may have sides that are inclined to decrease in width toward the plate layer 101 according to an aspect ratio. The contact plugs 170 may electrically connect the channel structures CH to an upper interconnection structure such as bit lines. The contact plugs 170 may be formed of a conductive material, and for example, may include at least one of tungsten (W), aluminum (Al), and copper (Cu).

The cell region insulating layer 190 may be disposed to cover the gate electrodes 130 and the channel structures CH. The cell region insulating layer 190 may include a plurality of insulating layers according to example embodiments. The cell region insulating layer 190 may be formed of an insulating material, and for example, may include at least one of silicon oxide, silicon nitride, and silicon oxynitride.

Figure 4:
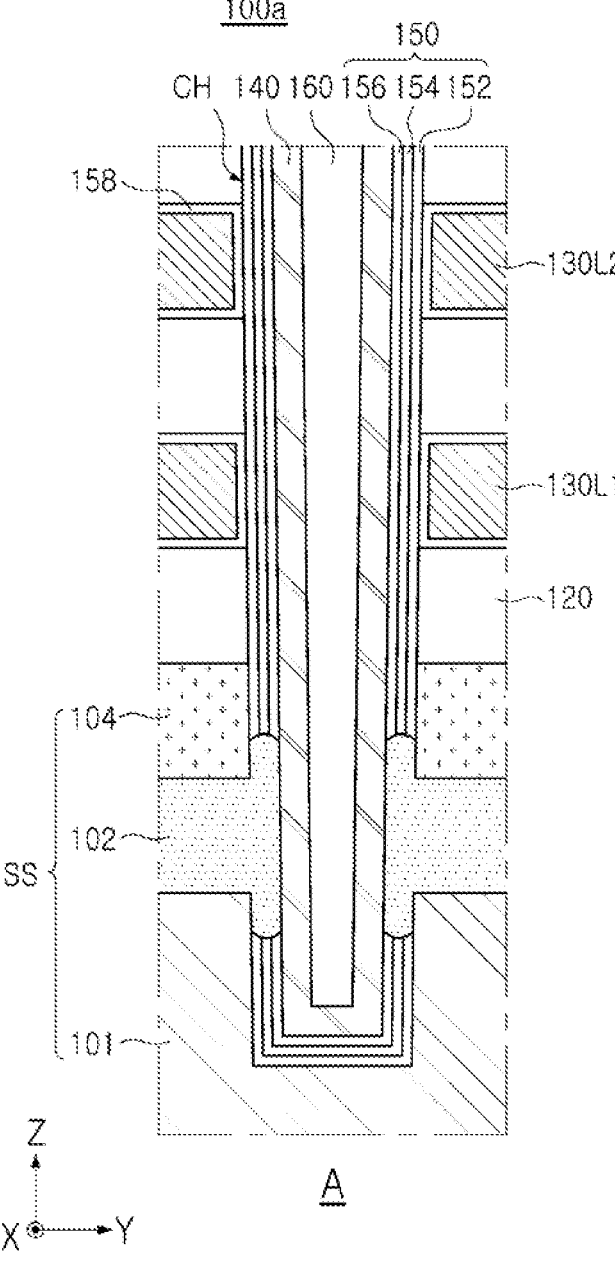
FIG. 4 is a partially enlarged view schematically illustrating a semiconductor device according to example embodiments.

FIG. 4 is a partially enlarged view schematically illustrating a semiconductor device according to example embodiments. FIG. 4 is an enlarged view of an area corresponding to area 'A' of FIG. 2.

Referring to FIG. 4, in a semiconductor device 100a, the channel structures CH may not include the metal silicide layer 145. The metal silicide layer 145 may be consumed while moving downwardly along the channel layer 140 and may not be present in the form of particles that may be identified by an electron microscope or the like. However, in this case, the channel layer 140 may include an element of the metal layer constituting the metal silicide layer 145, and the lower end of the region including the element of the metal layer may be adjacent to the lower end of the channel layer 140.

In some embodiments, a portion of the channel structures CH may include the metal silicide layer 145 as illustrated in FIG. 3, and other portions may not include the metal silicide layer 145 as illustrated in FIG. 4.

Figure 5:
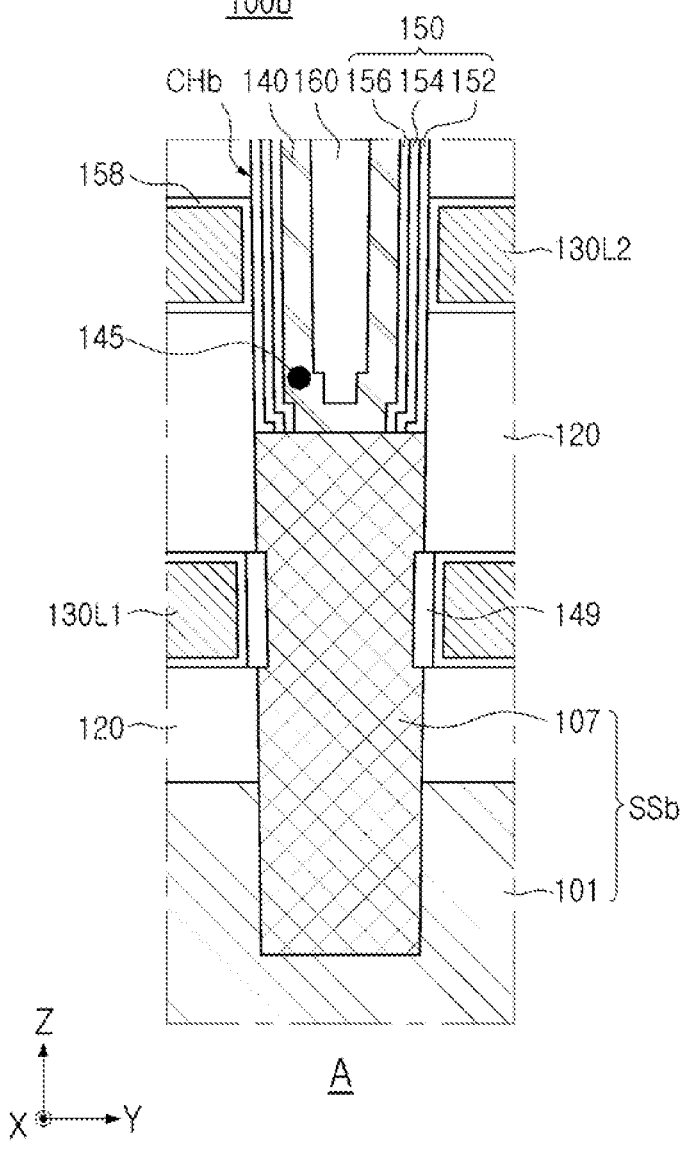
FIG. 5 is a partially enlarged view schematically illustrating a semiconductor device according to example embodiments.

FIG. 5 is a partially enlarged view schematically illustrating a semiconductor device according to example embodiments. FIG. 5 illustrates an enlarged area corresponding to area 'A' of FIG. 2.

Referring to FIG. 5, a semiconductor device 100b may not include the first and second horizontal conductive layers 102 and 104 on the plate layer 101, unlike the example embodiments of FIGS. 2 and 3. In addition, the source structure SSb may further include an epitaxial layer 107 disposed below the channel structure CHb in addition to the plate layer 101.

The epitaxial layer 107 may be disposed on the plate layer 101, below the channel structure CHb, and may be disposed on a side surface of at least one lowermost first gate electrode 130L1. The epitaxial layer 107 may be disposed in a recessed region of the plate layer 101. The height of the upper surface of the epitaxial layer 107 may be higher than the upper surface of the first gate electrode 130L1 and may be lower than the lower surface of the second gate electrode 130L2 thereon, but the disclosure is not limited thereto. The epitaxial layer 107 may be connected to the lower surface of the channel layer 140 through the upper surface. A gate insulating layer 149 may be further disposed between the epitaxial layer 107 and the first gate electrode 130L1 adjacent thereto.

In an embodiment, the metal silicide layer 145 may be positioned in the channel layer 140 on a level lower than the lower surface of the second gate electrode 130L2. In some embodiments, the metal silicide layer 145 may be located in contact with the epitaxial layer 107. The shape of the channel structure CHb and the source structure SSb may be applied to other embodiments.

Figure 6:
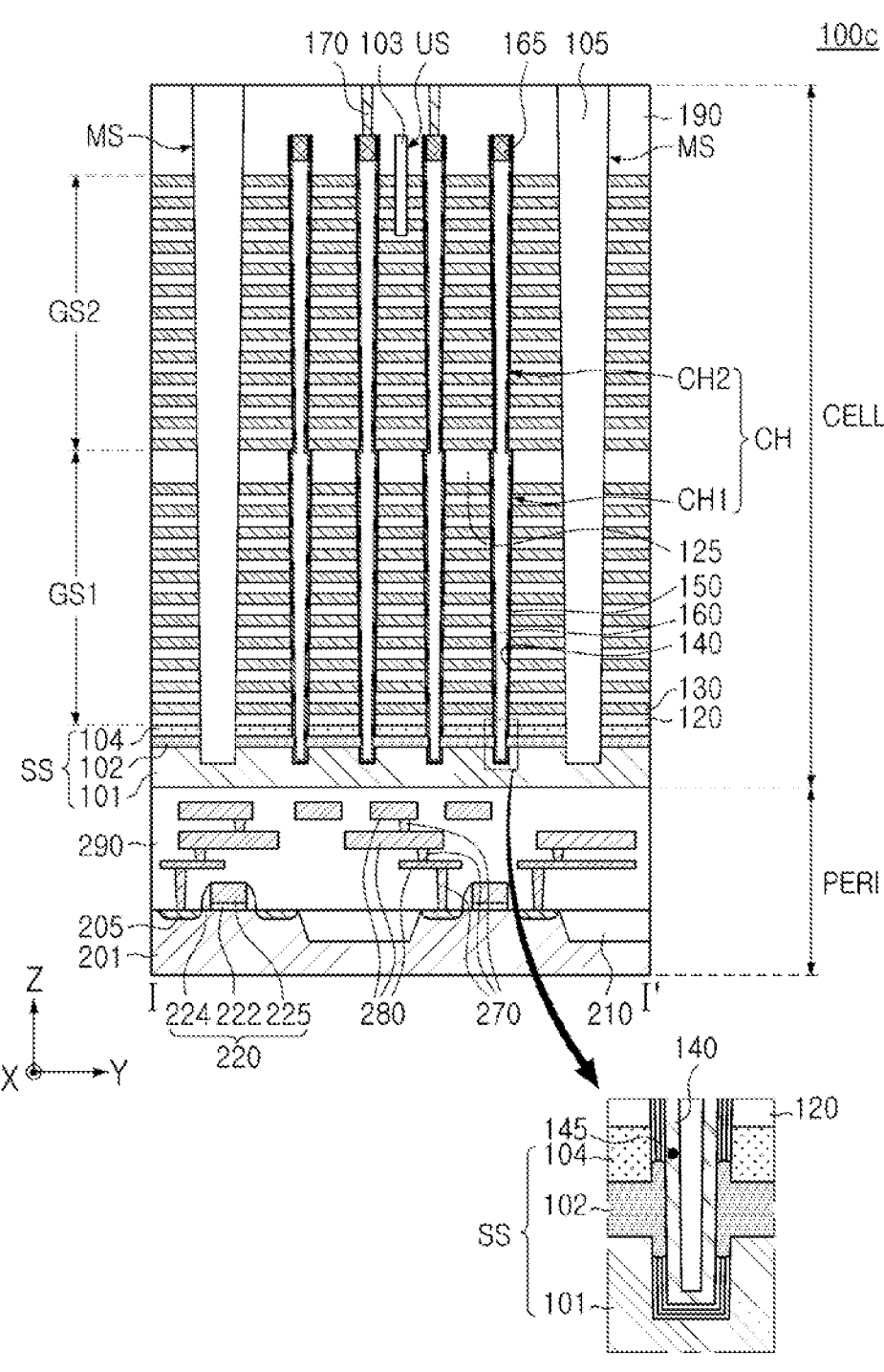
FIG. 6 is a schematic cross-sectional view of a semiconductor device according to example embodiments.

FIG. 6 is a schematic cross-sectional view of a semiconductor device according to example embodiments.

Referring to FIG. 6, a semiconductor device 100c may include a memory cell region CELL and a peripheral circuit region PERI stacked vertically. The memory cell region CELL may be disposed on the peripheral circuit region PERI. For example, in the case of the semiconductor device 100 of FIG. 2, the peripheral circuit region PERI is disposed on the plate layer 101 in a region not illustrated, or as in the semiconductor device 100c illustrated in FIG. 6, the peripheral circuit region PERI may be disposed in the lower portion. In example embodiments, the memory cell region CELL may also be disposed below the peripheral circuit region PERI. For the description of the memory cell region CELL, the descriptions with reference to FIGS. 1 to 3 may be equally applied.

The peripheral circuit region PERI may include a base substrate 201, circuit elements 220 disposed on the base substrate 201, circuit contact plugs 270, and circuit interconnection lines 280.

The base substrate 201 may have an upper surface extending in the X-direction and the Y-direction. Device isolation layers 210 may be formed on the base substrate 201 to define an active region. Source/drain regions 205 including impurities may be disposed in a portion of the active region. The base substrate 201 may include a semiconductor material, for example, a group IV semiconductor, a group III-V compound semiconductor, or a group II-VI compound semiconductor. The base substrate 201 may be provided as a bulk wafer or an epitaxial layer. In this embodiment, the upper plate layer 101 may be provided as a polycrystalline semiconductor layer such as a polycrystalline silicon layer or an epitaxial layer.

The circuit elements 220 may include planar transistors. Each of the circuit elements 220 may include a circuit gate dielectric layer 222, a spacer layer 224, and a circuit gate electrode 225. The source/drain regions 205 may be disposed in the base substrate 201, on both sides of the circuit gate electrode 225.

A peripheral region insulating layer 290 may be disposed on the circuit element 220, on the base substrate 201. The circuit contact plugs 270 may pass through the peripheral region insulating layer 290 to be connected to the source/drain regions 205. An electrical signal may be applied to the circuit element 220 by the circuit contact plugs 270. In an area not illustrated, circuit contact plugs 270 may also be connected to the circuit gate electrode 225. The circuit interconnection lines 280 may be connected to the circuit contact plugs 270 and may be disposed as a plurality of layers.

In a semiconductor device 200, after the peripheral circuit region PERI is first manufactured, the plate layer 101 of the memory cell region CELL may be formed thereon to manufacture the memory cell region CELL. The plate layer 101 may have the same size as the base substrate 201 or may be formed smaller than the base substrate 201. The memory cell region CELL and the peripheral circuit region PERI may be connected to each other in an area not illustrated. For example, one end of the gate electrode 130 in the Y-direction may be electrically connected to the circuit elements 220. The form in which the memory cell region CELL and the peripheral circuit region PERI are vertically stacked may be applied to other embodiments.

Figure 7:
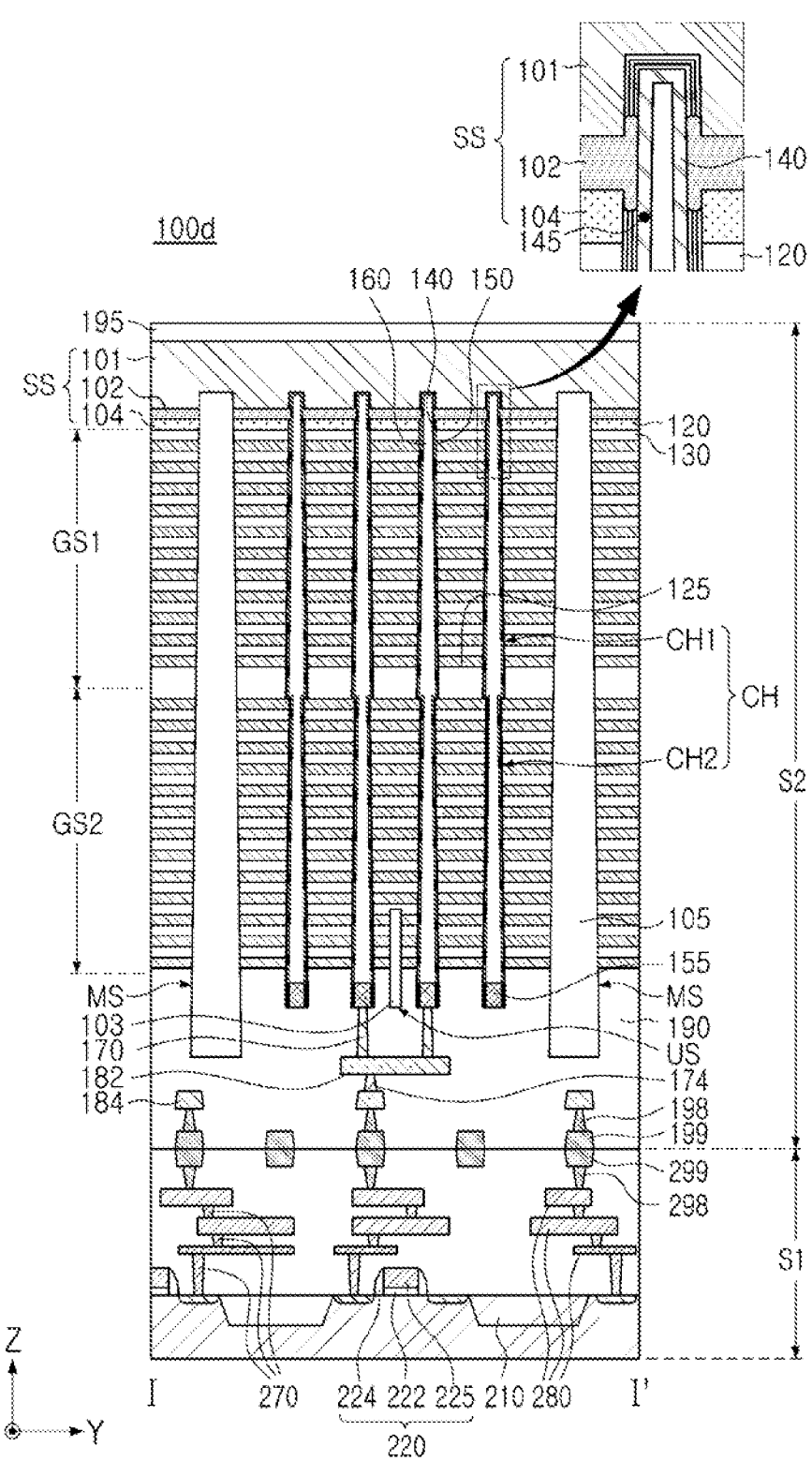
FIG. 7 is a schematic cross-sectional view of a semiconductor device according to example embodiments.

FIG. 7 is a schematic cross-sectional view of a semiconductor device according to example embodiments.

Referring to FIG. 7, a semiconductor device 100d may include a first semiconductor structure S1 and a second semiconductor structure S2 bonded by a wafer bonding method.

The description of the peripheral circuit region PERI described above with reference to FIG. 6 may be applied to the first semiconductor structure S1. However, the first semiconductor structure S1 may further include first bonding vias 298 and first bonding pads 299 which are bonding structures. The first bonding vias 298 may be disposed on the uppermost circuit interconnection lines 280 to be connected to the circuit interconnection lines 280. At least a portion of the first bonding pads 299 may be connected to the first bonding vias 298, on the first bonding vias 298. The first bonding pads 299 may be connected to the second bonding pads 199 of the second semiconductor structure S2. The first bonding pads 299 together with the second bonding pads 199 may provide an electrical connection path according to the bonding between the first semiconductor structure S1 and the second semiconductor structure S2. The first bonding vias 298 and the first bonding pads 299 may include a conductive material, for example, copper (Cu).

For the second semiconductor structure S2, the descriptions with reference to FIGS. 1 to 3 may be equally applied, unless otherwise specified. The second semiconductor structure S2 may further include first and second cell interconnection lines 182 and 184 and vias 174 which are interconnection structures, and may further include second bonding vias 198 which are bonding structures, and second bonding pads 199. The second semiconductor structure S2 may further include a protective layer 195 covering the upper surface of the plate layer 101.

The first cell interconnection line 182 may be connected to the contact plugs 170, and the via 174 may connect the first and second cell interconnection lines 182 and 184 to each other. However, in example embodiments, the number of layers and arrangement of the contact plugs, vias, and interconnection lines constituting the interconnection structure may be variously changed. The first and second cell interconnection lines 182 and 184 and the via 174 may be formed of a conductive material, and may be formed of, for example, at least one of tungsten (W), aluminum (Al), and copper (Cu).

The second bonding vias 198 and the second bonding pads 199 may be disposed below lowermost second cell interconnection lines 184. The second bonding vias 198 may be connected to the second cell interconnection lines 184 and the second bonding pads 199, and the second bonding pads 199 may be bonded to the first bonding pads 299 of the first semiconductor structure S1. The second bonding vias 198 and the second bonding pads 199 may include a conductive material, for example, copper (Cu).

The first semiconductor structure Si and the second semiconductor structure S2 may be bonded by copper (Cu)-copper (Cu) bonding by the first bonding pads 299 and the second bonding pads 199. In addition to the copper (Cu)-copper (Cu) bonding, the first semiconductor structure S1 and the second semiconductor structure S2 may be additionally bonded by dielectric-dielectric bonding. The dielectric-dielectric bonding may be bonding by dielectric layers forming respective portions of the peripheral region insulating layer 290 and the cell region insulating layer 190 and respectively surrounding the first bonding pads 299 and the second bonding pads 199. Accordingly, the first semiconductor structure Si and the second semiconductor structure S2 may be bonded without a separate adhesive layer.

Figure 8:
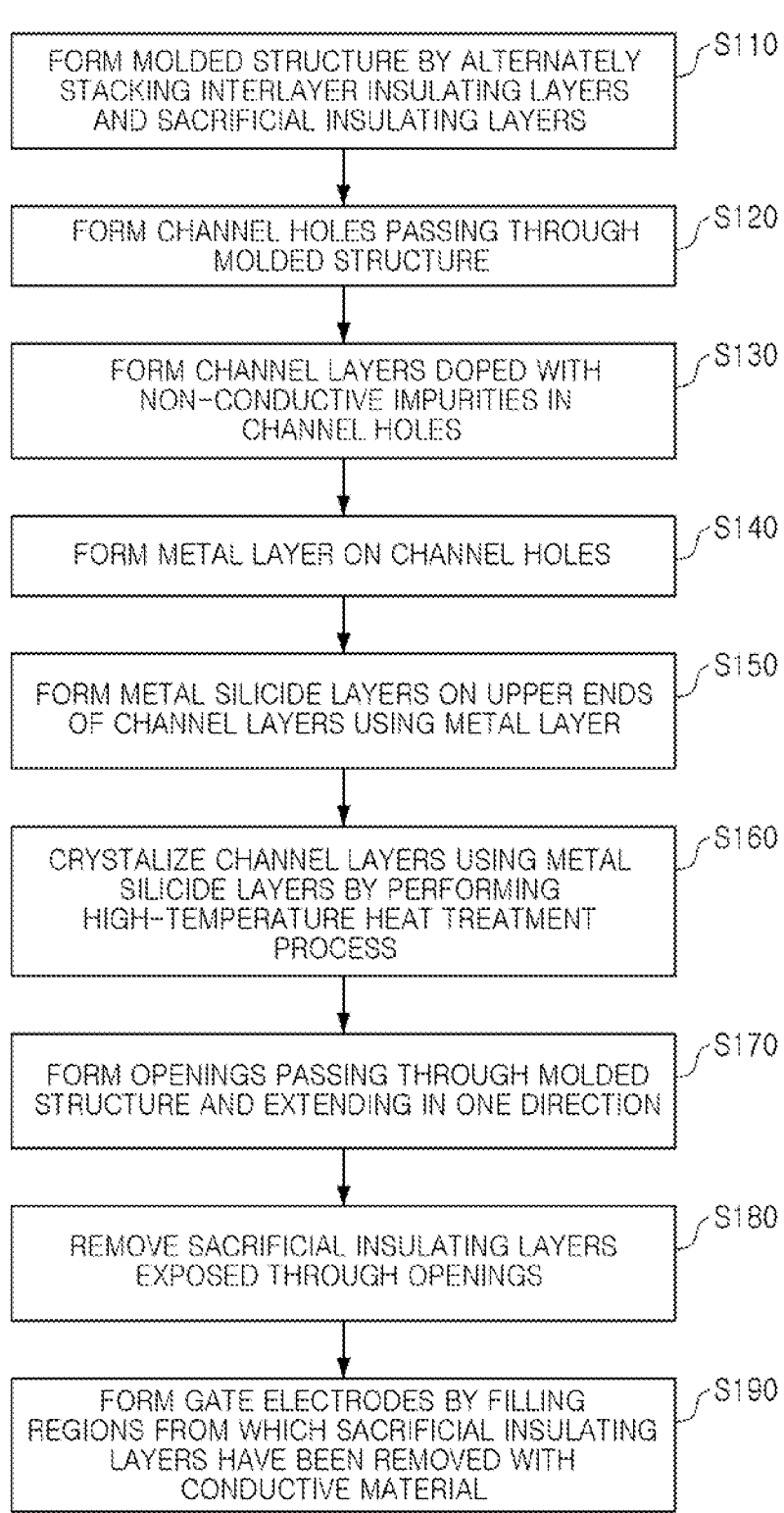
FIG. 8 is a flowchart illustrating a method of manufacturing a semiconductor device according to example embodiments.

FIG. 8 is a flowchart illustrating a method of manufacturing a semiconductor device according to example embodiments.

FIGS. 9 to 15 are schematic cross-sectional views illustrating a method of manufacturing a semiconductor device according to example embodiments. FIGS. 9, 10A, 11A, 12A, 13A, 14, and 15 illustrate regions corresponding to the region illustrated in FIG. 2. FIGS. 10B, 11B, 12B, and 13B are enlarged views of regions 'B' of FIGS. 10A, 11A, 12A, and 13A, respectively.

Figure 9:
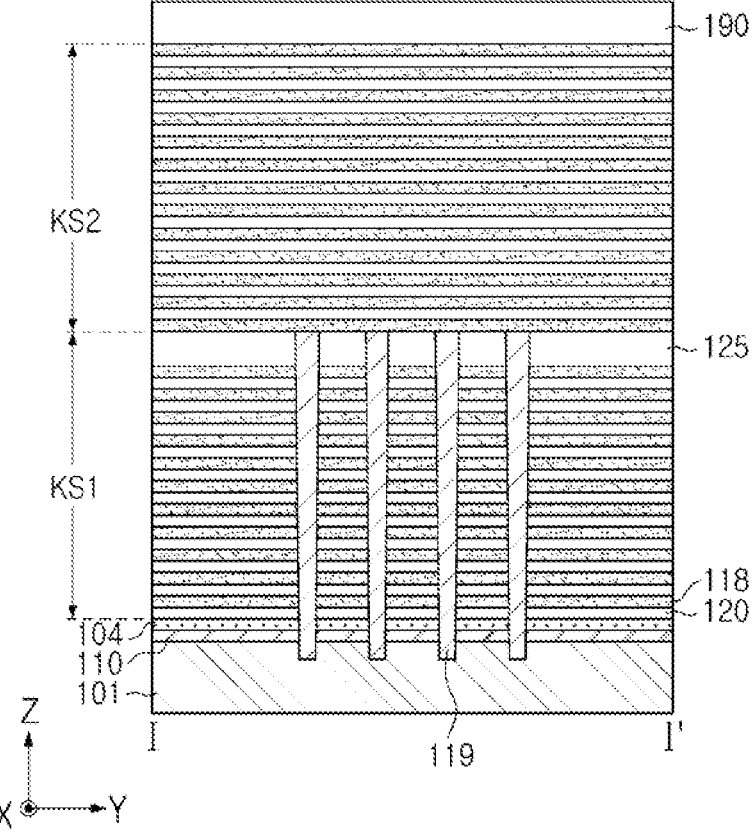
FIGS. 9, 10A, 10B, 11A, 11B, 12A, 12B, 13A, 13B, 14, and 15 are schematic cross-sectional views illustrating a method of manufacturing a semiconductor device according to example embodiments.

Referring to FIGS. 8 and 9, first and second molded structures KS1 and KS2 may be formed by alternately stacking sacrificial insulating layers 118 and interlayer insulating layers 120 (S110). In detail, the horizontal sacrificial layer 110 and the second horizontal conductive layer 104 are first formed on the plate layer 101, and after the first molded structure KS1 is formed, vertical sacrificial layers 119 penetrating through the first molded structure KS1 may be formed, and the second molded structure KS2 may be formed.

The horizontal sacrificial layer 110 may include a plurality of layers including different materials. The horizontal sacrificial layer 110 may be layers replaced with the first horizontal conductive layer 102 (refer to FIG. 2) through a subsequent process. For example, the horizontal sacrificial layer 110 includes first and third layers formed of the same material as the interlayer insulating layers 120, and may further include a second layer formed of the same material as the sacrificial insulating layers 118 and disposed between the first layer and the third layer. The second horizontal conductive layer 104 may be formed on the horizontal sacrificial layer 110.

The sacrificial insulating layers 118 may be replaced by the gate electrodes 130 (refer to FIG. 2) through a subsequent process. The sacrificial insulating layers 118 may be formed of a material different from that of the interlayer insulating layers 120, and may be formed of a material that may be etched with etch selectivity for the interlayer insulating layers 120 under specific etching conditions. For example, the interlayer insulating layer 120 may be formed of at least one of silicon oxide and silicon nitride, and the sacrificial insulating layers 118 may be formed of a material, which is different from a material of the interlayer insulating layer 120 and is selected from silicon, silicon oxide, silicon carbide, and silicon nitride. A relatively thick intermediate interlayer insulating layer 125 may be formed on an uppermost portion of the first molded structure KS1. However, in example embodiments, the thicknesses of the interlayer insulating layers 120 may not all be the same. The thickness of the interlayer insulating layers 120 and the sacrificial insulating layers 118 and the number of layers constituting the interlayer insulating layers 120 and the sacrificial insulating layers 118 may be variously changed from those illustrated.

The vertical sacrificial layers 119 may be formed in a region corresponding to the first channel structures CH1 of FIG. 2. The vertical sacrificial layers 119 may be formed by forming lower channel holes to penetrate through the first molded structure KS1, and then depositing a material constituting the vertical sacrificial layers 119 in the lower channel holes, and performing a planarization process. The vertical sacrificial layers 119 may include a material different from that of the interlayer insulating layers 120 and the sacrificial insulating layers 118. For example, the vertical sacrificial layers 119 may include a semiconductor material such as polycrystalline silicon, a silicon-based insulating material, or a carbon-based material.

Next, a part of the cell region insulating layer 190 covering the stack structure of the sacrificial insulating layers 118 and the interlayer insulating layers 120 may be formed.

Figure 10A:
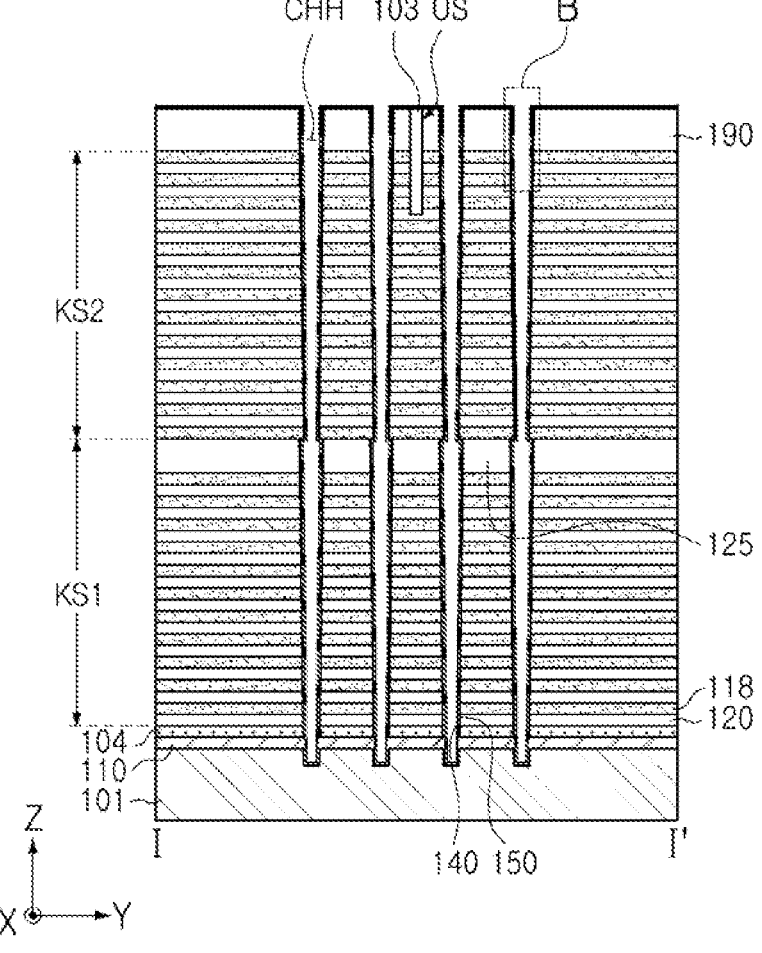
Figure 10B:
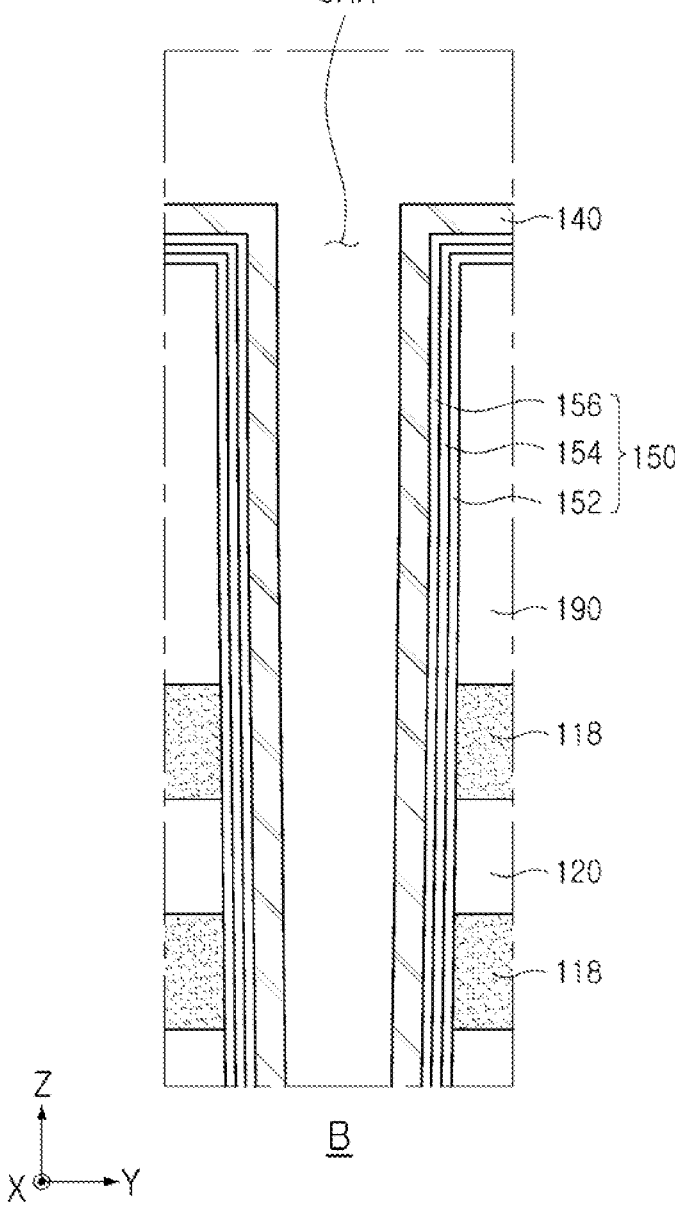

Referring to FIGS. 8, 10A, and 10B, channel holes CHH passing through the first and second molded structures KS1 and KS2 may be formed (S120), and channel dielectric layers 150 and channel layers 140 doped with non-conductive impurities may be formed in the channel holes CM (S130).

First, the upper isolation regions US may be formed in the second molded structure KS2 by removing portions of the sacrificial insulating layers 118 and the interlayer insulating layers 120. After exposing a region in which the upper separation regions US are to be formed using a separate mask layer and removing a predetermined number of sacrificial insulating layers 118 and interlayer insulating layers 120 from the top, an insulating material may be deposited, thereby forming the upper isolation insulating layer 103.

The channel holes CHH may be formed by anisotropically etching the first and second molded structures KS1 and KS2 using a mask layer. Due to the height of the stack structure, sidewalls of the channel holes CHH may not be perpendicular to the upper surface of the plate layer 101. The channel holes CHH may be formed to recess a portion of the plate layer 101.

The channel dielectric layers 150 may be formed by sequentially depositing a blocking layer 152, a charge storage layer 154, and a tunneling layer 156 in the channel holes CHH (see, e.g., FIG. 10B). The channel dielectric layers 150 may be formed to have a uniform thickness using an atomic layer deposition (ALD) or chemical vapor deposition (CVD) process.

The channel layers 140 may be formed on the channel dielectric layers 150 in the channel holes CHH. In this operation, the channel layers 140 may be formed of an amorphous semiconductor material such as amorphous silicon, and may be formed by in-situ doping with non-conductive impurities. The non-conductive impurities may include at least one of oxygen (O), carbon (C), and nitrogen (N). For example, the non-conductive impurities may be doped to have a concentration of about $4 \times 10^{20}/cm^3$ or more, for example, in a range of about $5 \times 10^{20}/cm^3$ to about $5 \times 10^{21}/cm^3$. In this operation, the channel layers 140 may not be doped with conductivity-type impurities.

Forming the channel layers 140 may include depositing the channel layers 140 by co-flowing a silicon source gas and a doping source gas including the non-conductive type impurities. For example, the silicon source gas may include at least one of monosilane ($SiH_4$), disilane ($Si_2H_6$), trisilane ($Si_3H_8$), and dichlorosilane ($SiH_2Cl_2$), and the doping source gas may be a gas containing at least one of oxygen (O), carbon (C), and nitrogen (N), for example, may include at least one of nitrous oxide ($N_2O$), ethylene ($C_2H_4$), and ammonia ($NH_3$). However, in some embodiments, the flowing of the silicon source gas and the flowing of the doping source gas including the non-conductive impurities may be sequentially performed. The channel layers 140 may be deposited at a temperature of about 300 degrees Celsius to about 500 degrees Celsius.

Figure 11A:
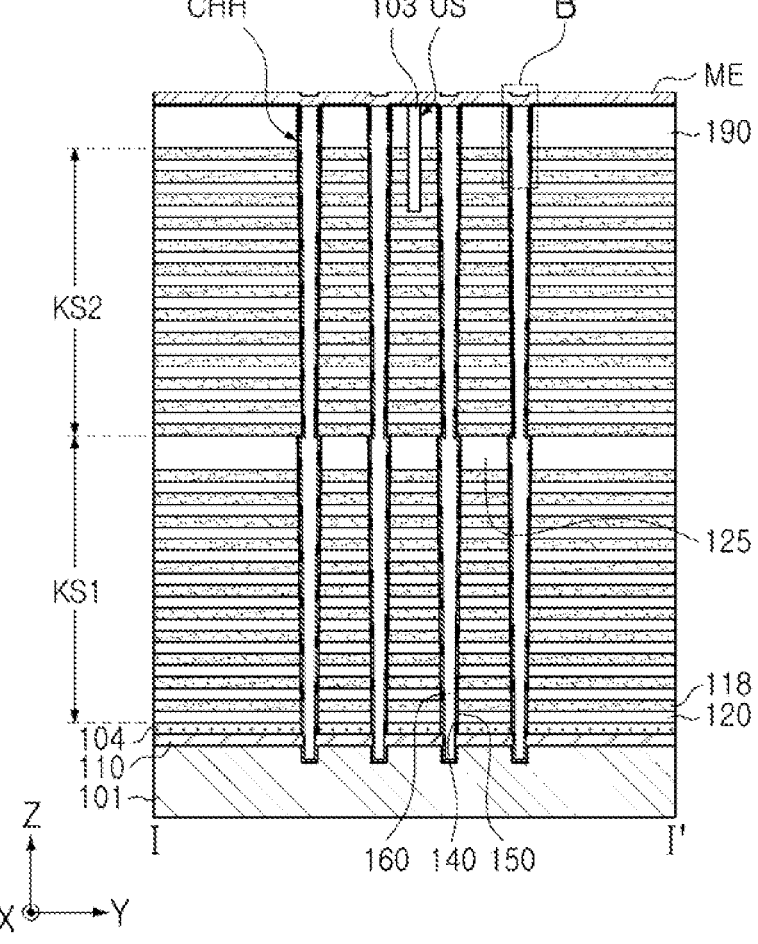
Figure 11B:
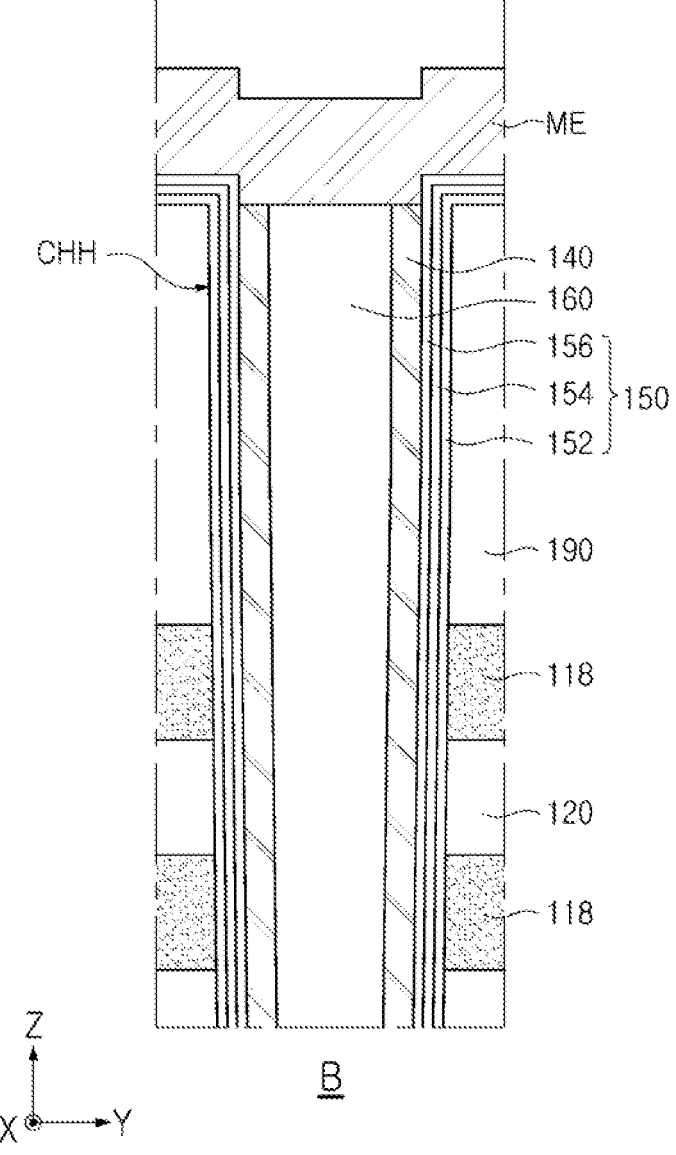

Referring to FIGS. 8, 11A, and 11B, the channel filling insulating layers 160 may be formed in the channel holes CHH, and a metal layer ME may be formed on the channel holes CHH (S140).

The channel filling insulating layers 160 may be formed to fill the channel holes CHH. Next, on the upper surface of the cell region insulating layer 190, the material forming the channel layers 140 and the channel filling insulating layers 160 is partially removed by a chemical mechanical polishing (CMP) process or the like, and then, the metal layer ME may be formed. The metal layer ME may include, for example, nickel (Ni), titanium (Ti), cobalt (Co), tungsten (W), platinum (Pt), palladium (Pd), or combinations thereof.

Figure 12A:
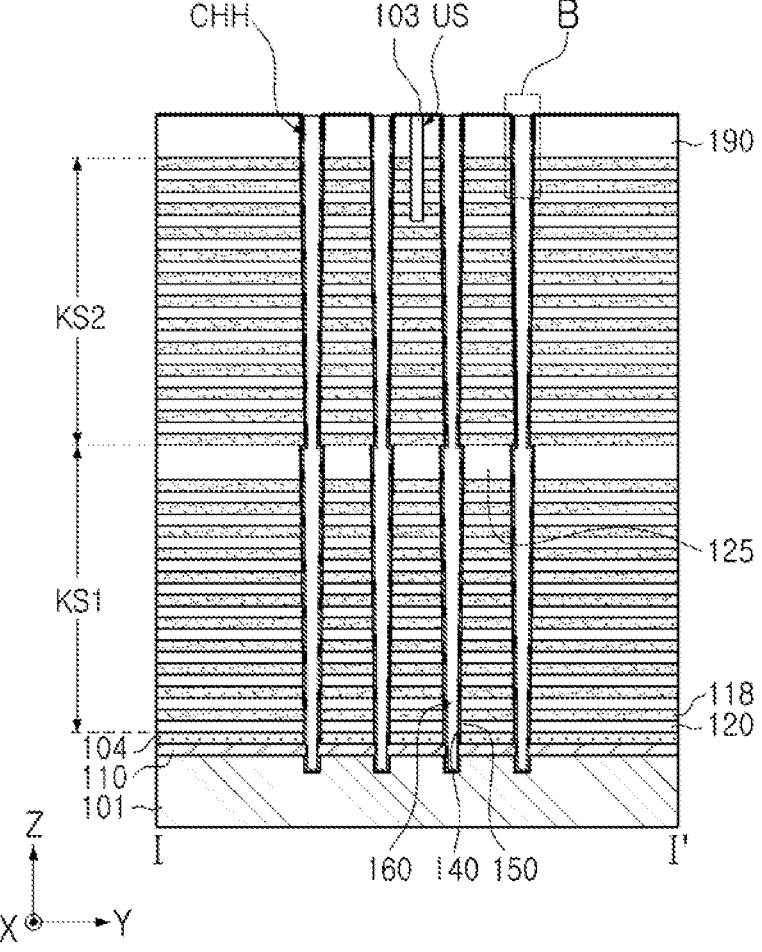
Figure 12B:
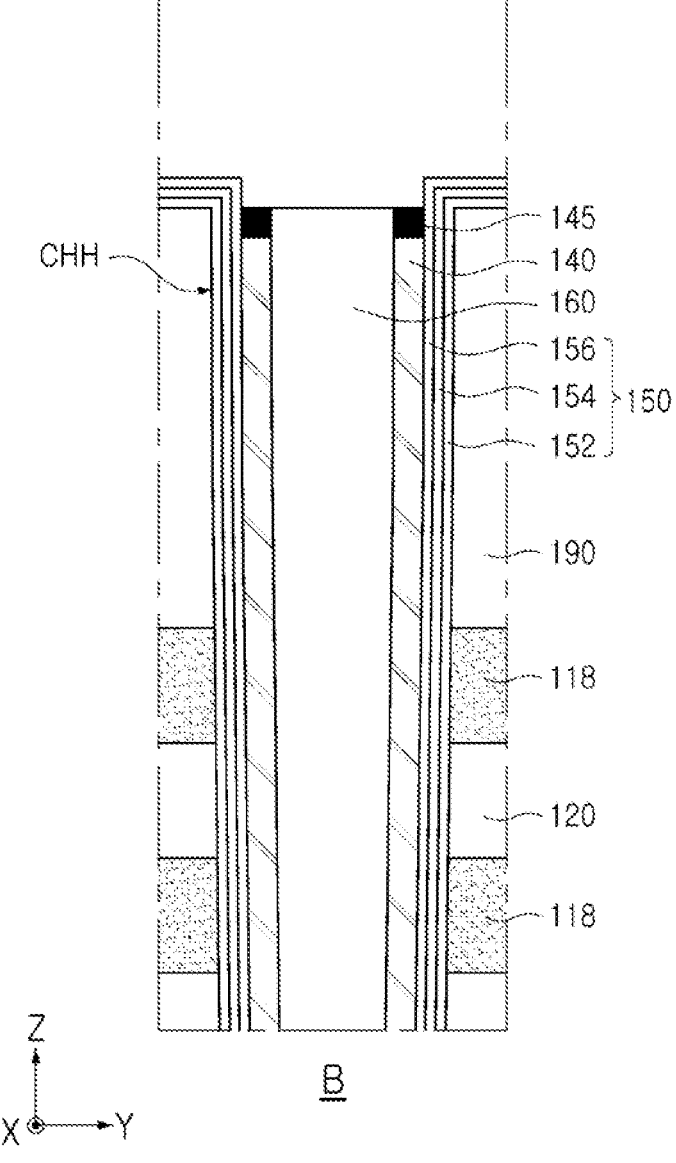

Referring to FIGS. 8, 12A, and 12B, the metal silicide layers 145 may be formed on upper ends of the channel layers 140 using the metal layer ME (S150).

The forming of the metal silicide layers 145 may include injecting a metal from the metal layer ME into the channel layers 140, removing the remaining metal layer ME, and performing a silicidation process. The operation of injecting the metal from the metal layer ME into the channel layers 140 may be an operation of injecting the metal elements into the channel layers 140 by applying heat at a temperature of about 200 degrees Celsius to about 300 degrees Celsius. The silicidation process is performed at a temperature of about 400 degrees Celsius to about 500 degrees Celsius, and the metal silicide layers 145 having a composition of $MSi_2$ (where M is a metal element) may be formed.

Figure 13A:
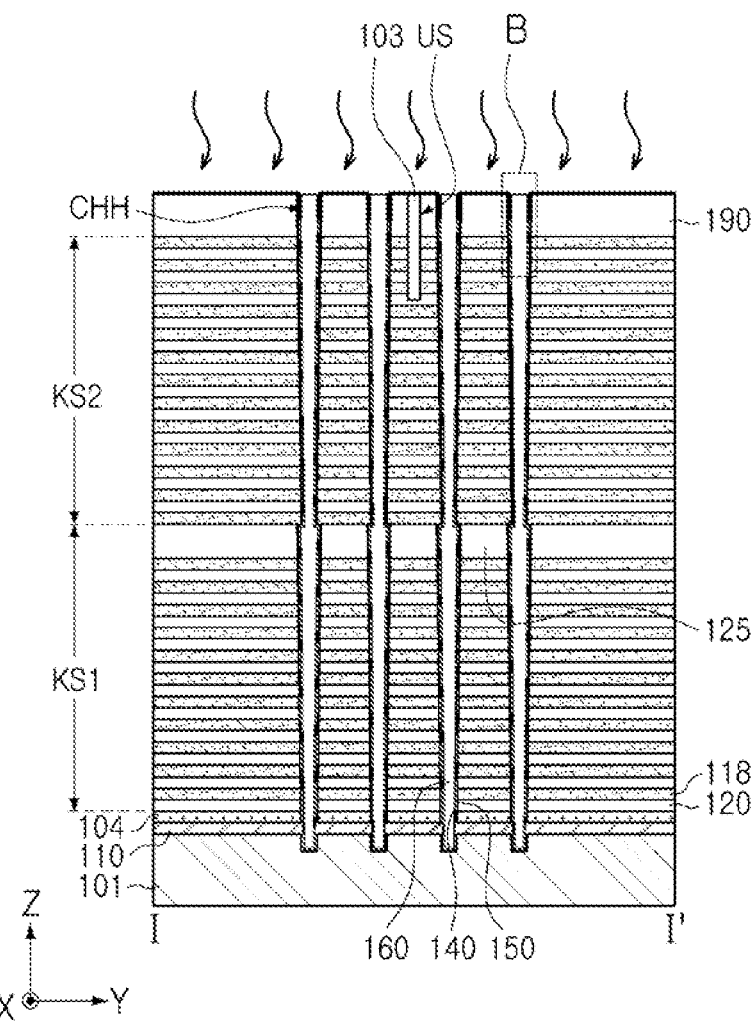
Figure 13B:
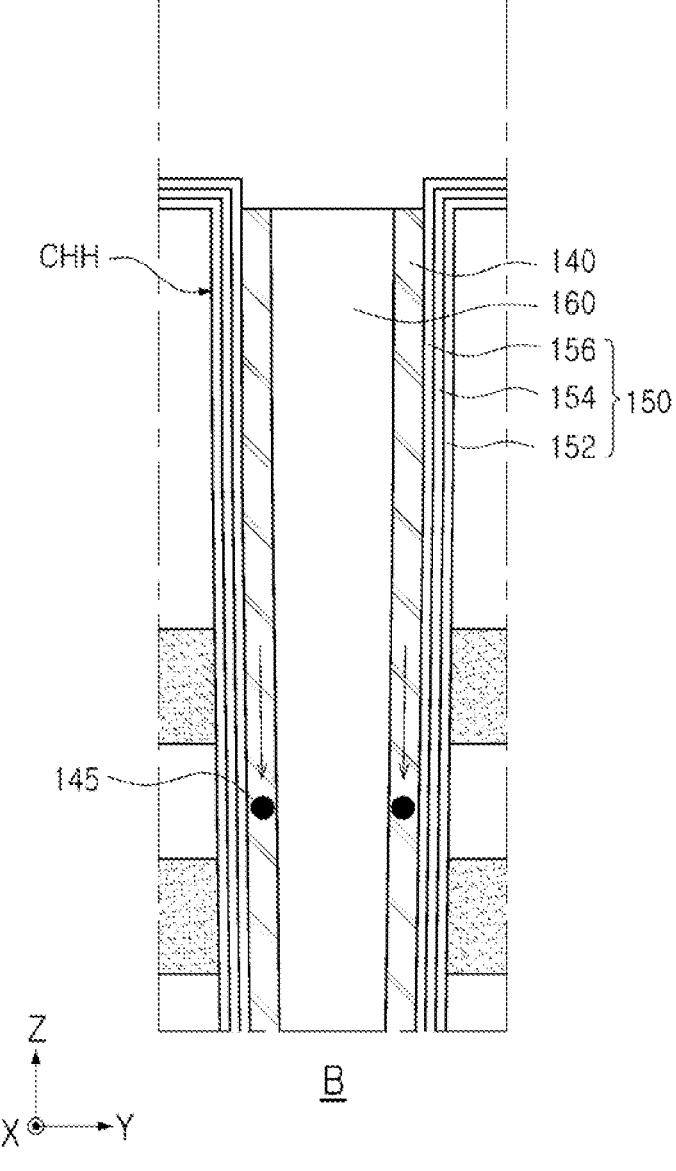

Referring to FIGS. 8, 13A, and 13B, the channel layers 140 may be crystallized using the metal silicide layers 145 by a high-temperature heat treatment process (S160).

The channel layers 140 may be crystallized by the MILC method using the metal silicide layers 145, and crystallization may be performed from the upper ends of the channel layers 140. Accordingly, the channel layers 140 may have a single crystal or a single crystal-like structure.

The heat treatment process may be performed at a temperature of about 800 degrees Celsius or more, for example, about 800 degrees Celsius to about 1000 degrees Celsius. The heat treatment process may be performed for a relatively short time, for example, from about 10 seconds to about 3 minutes by performing rapid thermal processing (RTP) or a laser annealing process. The heat treatment process may be performed in a single type performed on one wafer, rather than a batch type performed on a plurality of wafers, for example, the plate layer 101. In other words, the heat treatment process may be performed on one plate layer 101 without simultaneously being performed on another plate layer 101.

The metal silicide layers 145 may move downwardly along the channel layers 140 in an amorphous state while crystallizing the channel layers 140 and may be fixed in the lower region including the lower ends of the channel layers 140. The metal silicide layer 145 may remain as one particle in each of the channel layers 140. After crystallization is performed, the metal silicide layers 145 may be located at a level lower than the lower surface of the lowermost sacrificial insulating layer 118, and in detail, may be located at a level lower than the upper surface of the second horizontal conductive layer 104.

Since the channel layers 140 contain non-conductive impurities, solid-state crystallization is delayed in the region below the metal silicide layers 145, and thus, the metal silicide layer 145 may easily move downwardly while crystallizing most of the channel layers 140 by the MILC method. In addition, by performing a single-type crystallization process by applying high heat for a relatively short time, the metal silicide layers 145 may not be separated into multiple particles, but may be present as a single particle for each channel hole CHH.

Figure 14:
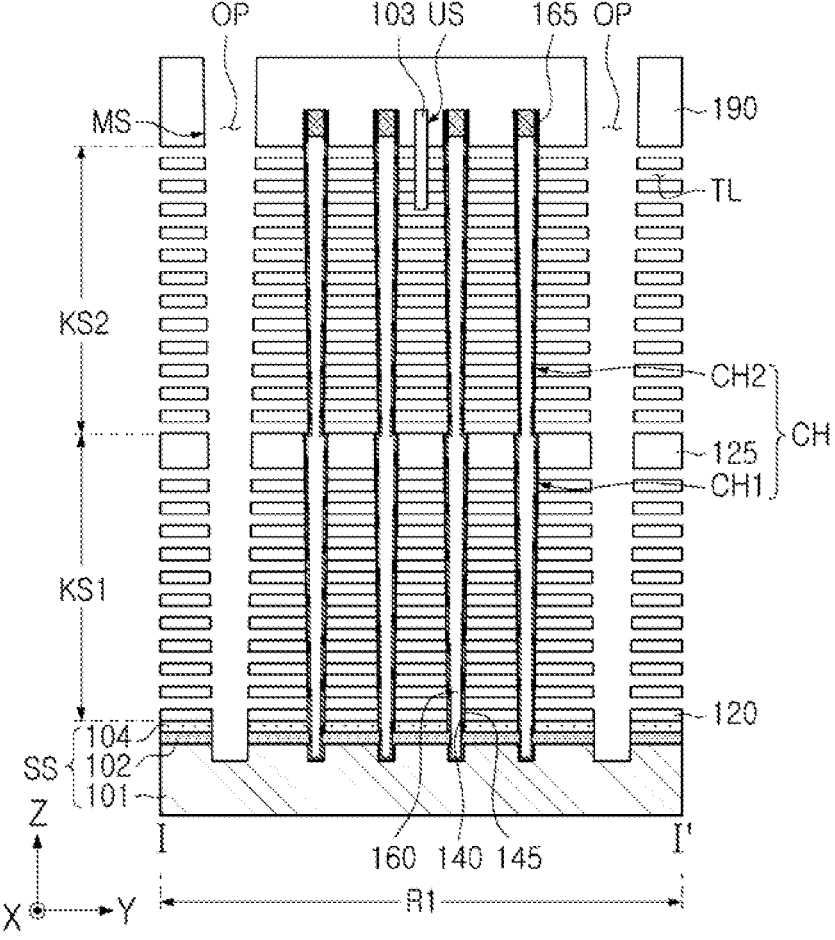

Referring to FIG. 14, channel pads 165 are formed in the channel holes CM to form channel structures CH, and openings OP passing through the first and second molded structures KS1 and KS2 are formed (S170), and after the first horizontal conductive layer 102 is formed, the sacrificial insulating layers 118 may be removed to form tunnel portions TL (S180).

The channel pads 165 may be formed after partially removing the channel layer 140 from the upper end of the channel holes CM. The channel pads 165 may be formed of a conductive material, for example, silicon. However, in some embodiments, the channel pads 165 may be formed as a portion of the channel layers 140 without being formed by a separate process. Accordingly, channel structures CH may be formed.

After the cell region insulating layer 190 is additionally formed on the channel structures CH, the openings OP may be formed. The openings OP may be formed to penetrate through the first and second molded structures KS1 and KS2, and a lower portion of the openings OP may penetrate through the second horizontal conductive layer 104 to extend in the X-direction.

Next, separate sacrificial spacer layers may be formed in the openings OP and an etchback process may be performed to expose the horizontal sacrificial layer 110, and the horizontal sacrificial layer 110 may be removed from the exposed region. The horizontal sacrificial layer 110 may be removed by, for example, a wet etching process. During the removal process of the horizontal sacrificial layer 110, a portion of the channel dielectric layer 150 exposed in the region from which the horizontal sacrificial layer 110 has been removed may also be removed. After the first horizontal conductive layer 102 is formed by depositing a conductive material in the region in which the horizontal sacrificial layer 110 has been removed, the sacrificial spacer layers may be removed in the openings OP. By this process, the source structure SS including the plate layer 101 and the first and second horizontal conductive layers 102 and 104 may be formed.

The sacrificial insulating layers 118 may be selectively removed with respect to the interlayer insulating layers 120 using, for example, wet etching. Accordingly, a plurality of tunnel portions TL may be formed between adjacent ones of the interlayer insulating layers 120.

Figure 15:
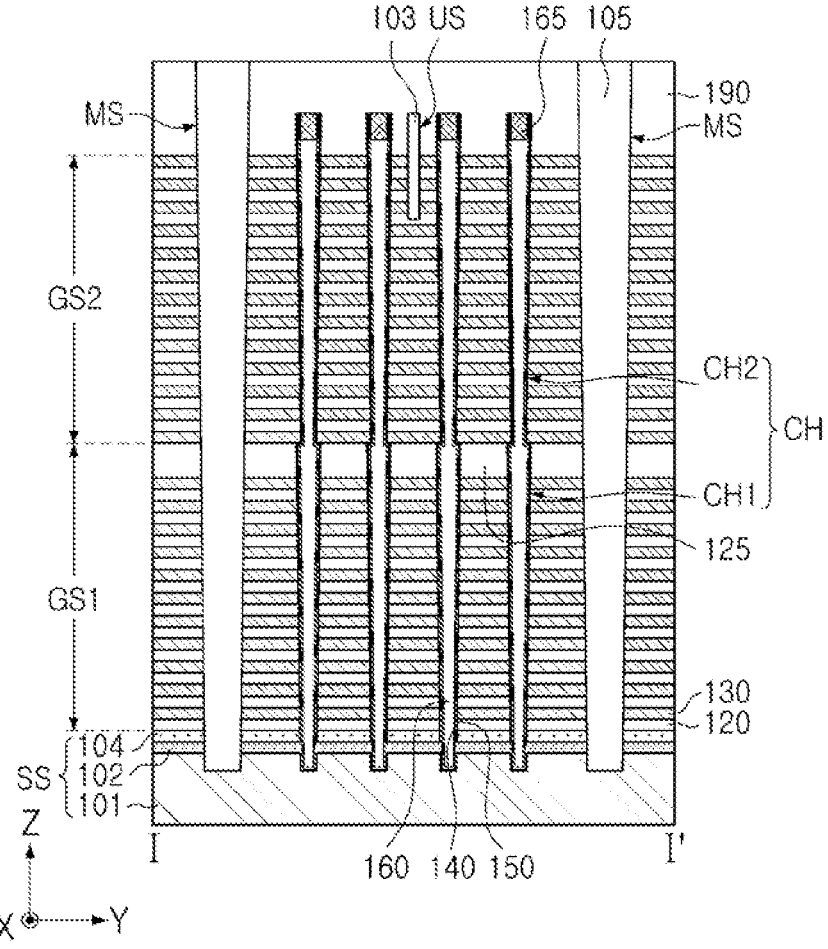

Referring to FIG. 15, the gate electrodes 130 may be formed by filling the tunnel portions TL with a conductive material (S190), and the isolation insulating layer 105 may be formed.

First, the material may form the horizontal blocking layer 158 (refer to FIG. 3) in the tunnel portions TL. The conductive material forming the gate electrodes 130 may fill the tunnel portions TL. The conductive material may include a metal, polycrystalline silicon, or a metal silicide material. After forming the gate electrodes 130, the conductive material deposited in the openings OP may be removed through an additional process, and then the isolation insulating layer 105 may be formed.

Next, referring to FIG. 15 and FIG. 2 together, the semiconductor device 100 may be manufactured by forming contact plugs 170 connected to the channel structures CH by penetrating through the cell region insulating layer 190.

Figure 16:
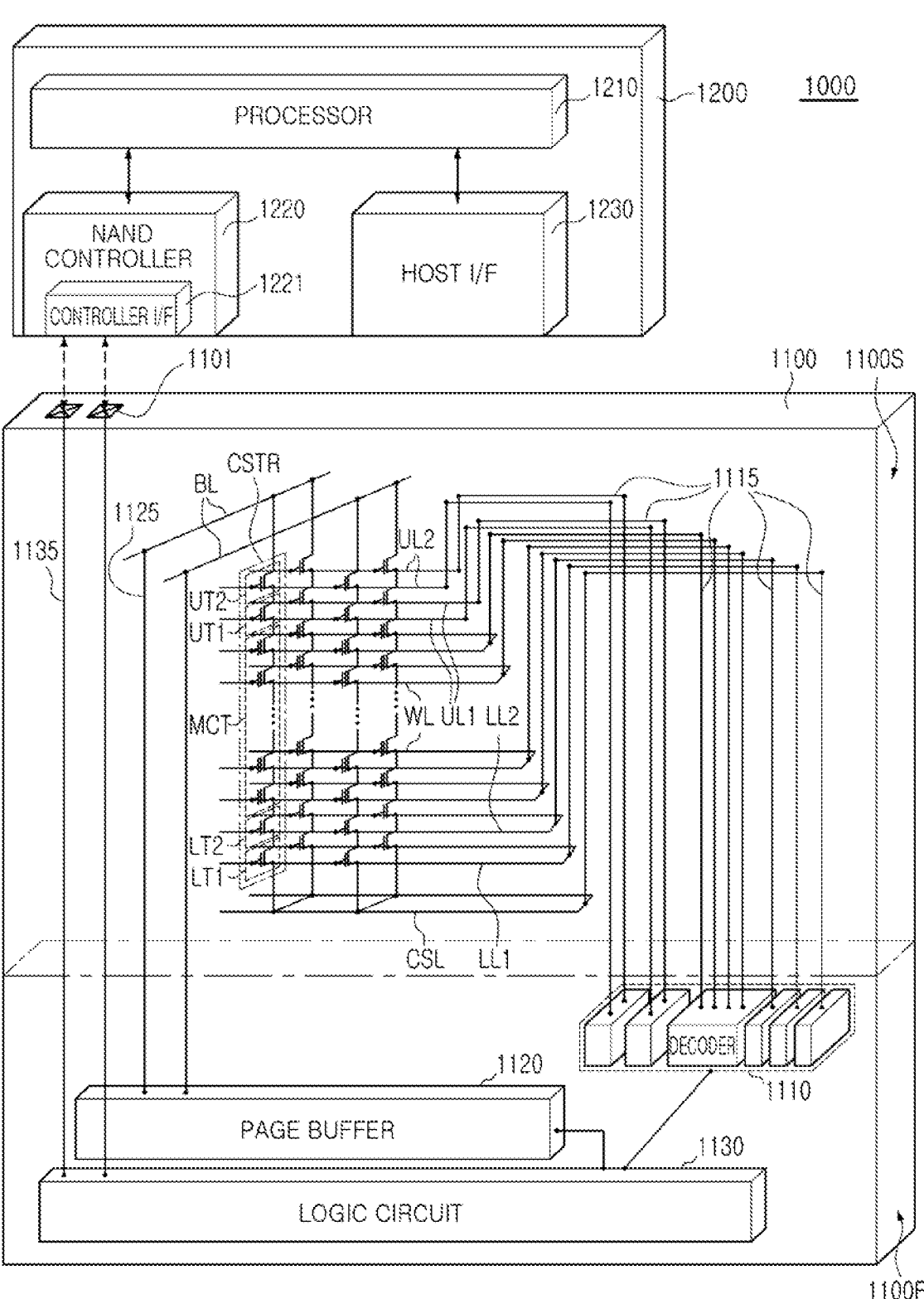
FIG. 16 is a diagram schematically illustrating a data storage system including a semiconductor device according to example embodiments.

FIG. 16 is a diagram schematically illustrating a data storage system including a semiconductor device according to example embodiments.

Referring to FIG. 16, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD), a universal serial bus (USB), a computing system, a medical device, or a communication device, including one or a plurality of semiconductor devices 1100.

The semiconductor device 1100 may be a nonvolatile memory device, for example, the NAND flash memory device described above with reference to FIGS. 1 to 12. The semiconductor device 1100 may include a first semiconductor structure 1100F and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT2 may be used for an erase operation of erasing data stored in the memory cell transistors MCT using the GIDL phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the inside of the first semiconductor structure 1100F to the second semiconductor structure 1100S. The bit lines BL may be electrically connected to the page buffer 1120 through second connection interconnections 1125 extending from the inside of the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection interconnection 1135 extending from the inside of the first semiconductor structure 1100F to the second semiconductor structure 1100S.

The controller 1200 may include a processor 1210, a NAND controller 1220, and a host interface 1230. In some embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 that processes communication with the semiconductor device 1100. Through the controller interface 1221, a control command for controlling the semiconductor device 1100, data to be written to the memory cell transistors MCT of the semiconductor device 1100, data to be read from the memory cell transistors MCT, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 17:
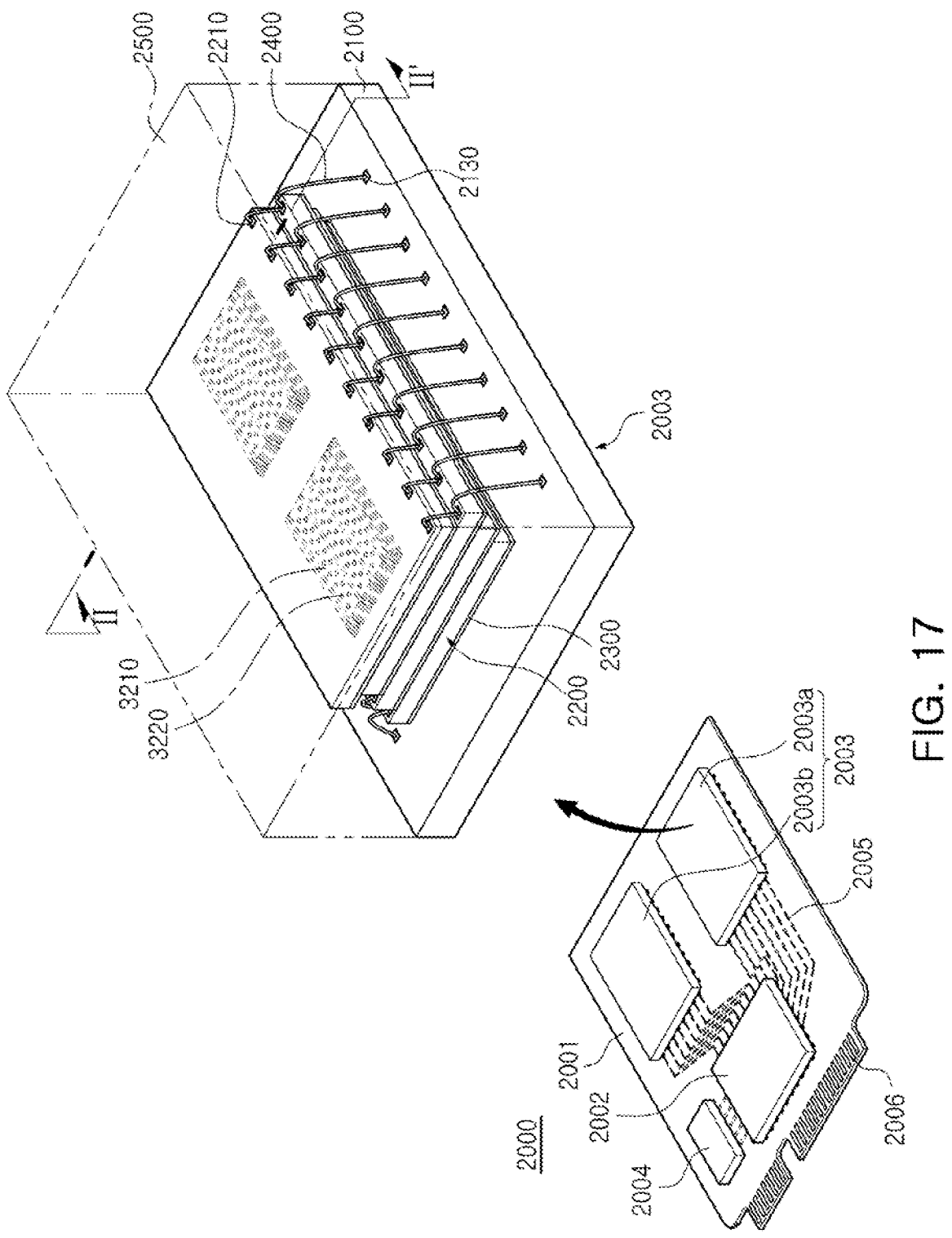
FIG. 17 is a schematic perspective view of a data storage system including a semiconductor device according to an example embodiment.

FIG. 17 is a schematic perspective view of a data storage system including a semiconductor device according to an example embodiment.

Referring to FIG. 17, a data storage system 2000 according to an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as a Universal Serial Bus (USB), Peripheral Component Interconnect Express (PCI-Express), Serial Advanced Technology Attachment (SATA), an M-Phy for Universal Flash Storage (UFS), and the like. In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000.

The DRAM 2004 may be a buffer memory for reducing a speed difference between the semiconductor package 2003 as a data storage space and an external host. The DRAM 2004 included in the data storage system 2000 may also operate as a kind of cache memory, and may provide a space for temporarily storing data in a control operation for the semiconductor package 2003. For example, when the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including upper package pads 2130. Each semiconductor chip 2200 may include an input/output pad 2210. The input/output pad 2210 may correspond to the input/output pad 1101 of FIG. 16. Each of the semiconductor chips 2200 may include gate stack structures 3210 and channel structures 3220. Each of the semiconductor chips 2200 may include the semiconductor device described above with reference to FIGS. 1 to 7.

In example embodiments, the connection structure 2400 may be a bonding wire electrically connecting the input/output pad 2210 and the upper package pads 2130. Accordingly, in each of the first and second semiconductor packages 2003a and 2003b, the semiconductor chips 2200 may be electrically connected to each other by a bonding wire method, and may be electrically connected to the upper package pads 2130 of the package substrate 2100. According to example embodiments, in each of the first and second semiconductor packages 2003a and 2003b, the semiconductor chips 2200 may also be electrically connected to each other by a connection structure including a Through Silicon Via (TSV) instead of the connection structure 2400 of the bonding wire method.

In example embodiments, the controller 2002 and the semiconductor chips 2200 may be included in one package. In an example embodiment, the controller 2002 and the semiconductor chips 2200 may be mounted on a separate interposer substrate different from the main board 2001, and the controller 2002 and the semiconductor chips 2200 may be connected to each other by interconnections formed on the interposer substrate.

Figure 18:
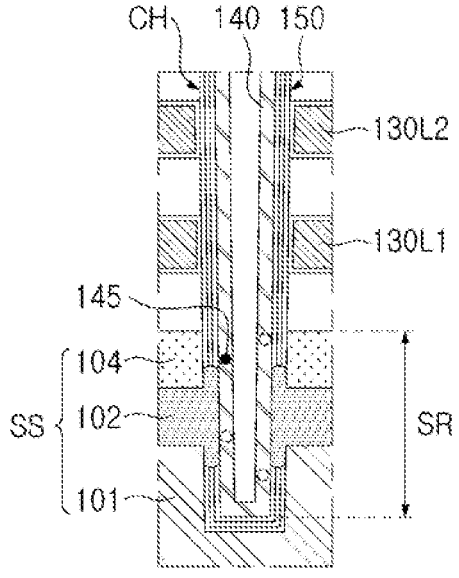
FIG. 18 is a cross-sectional view schematically illustrating a semiconductor package according to an example embodiment.
Figure 18:
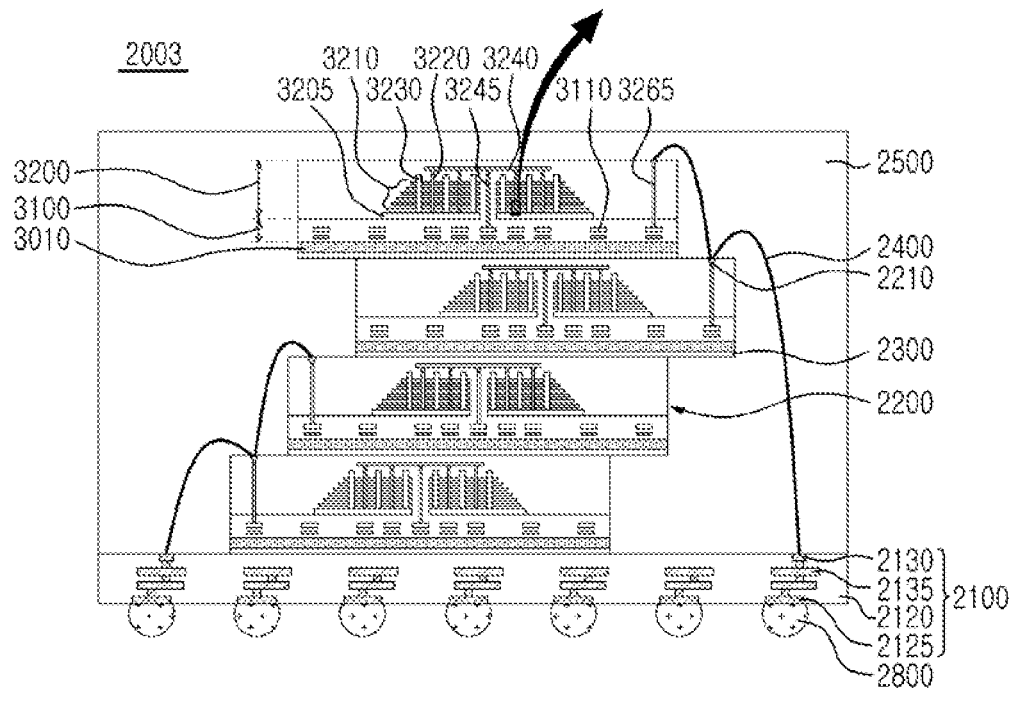

FIG. 18 is a cross-sectional view schematically illustrating a semiconductor package according to an example embodiment. FIG. 18 illustrates an example embodiment of the semiconductor package 2003 of FIG. 17, and conceptually illustrates a region taken along line II-IF of the semiconductor package 2003 of FIG. 17.

Referring to FIG. 18, in the semiconductor package 2003, the package substrate 2100 may be a printed circuit board. The package substrate 2100 may include a package substrate body 2120, package upper pads 2130 (see FIG. 17) disposed on an upper surface of the package substrate body 2120, lower package pads 2125 disposed on or exposed through the lower surface of the package substrate body 2120, and internal interconnections 2135 electrically connecting the upper package pads 2130 and the lower package pads 2125 inside the package substrate body 2120. The upper package pads 2130 may be electrically connected to the connection structures 2400. The lower package pads 2125 may be connected to the interconnection patterns 2005 of the main board 2001 of the data storage system 2000 as illustrated in FIG. 17 through conductive connection portions 2800.

Each of the semiconductor chips 2200 may include a semiconductor substrate 3010, and a first semiconductor structure 3100 and a second semiconductor structure 3200 that are sequentially stacked on the semiconductor substrate 3010. The first semiconductor structure 3100 may include a peripheral circuit region including peripheral interconnections 3110. The second semiconductor structure 3200 may include a common source line 3205, a gate stack structure 3210 on the common source line 3205, channel structures 3220 and separation regions 3230 passing through the gate stack structure 3210, bit lines 3240 electrically connected to the memory channel structures 3220, and cell contact plugs 3245 electrically connected to the word lines WL of the gate stack structure 3210 (see FIG. 16). As described above with reference to FIGS. 1 to 7, in each of the semiconductor chips 2200, the channel layers 140 in the channel structures CH may include doped non-conductive impurities, and the channel structures CH each may include a metal silicide layer 145 positioned in the fixed region SR.

Each of the semiconductor chips 2200 may include a through interconnection 3265 electrically connected to the peripheral interconnections 3110 of the first semiconductor structure 3100 and extending into the second semiconductor structure 3200. The through interconnection 3265 may be disposed outside the gate stack structure 3210, and may be further disposed to pass through the gate stack structure 3210. Each of the semiconductor chips 2200 may further include an input/output pad 2210 (refer to FIG. 17) electrically connected to the peripheral interconnections 3110 of the first semiconductor structure 3100.

As set forth above, a semiconductor device having improved reliability and a method of manufacturing the semiconductor device may be provided by doping a channel layer with non-conductive impurities and performing the MILC process at a high temperature.

While example embodiments have been illustrated and described above, it will be apparent to those skilled in the art that modifications and variations could be made without departing from the scope of the disclosure as defined by the appended claims.

What is claimed is:

1. A method of manufacturing a semiconductor device, comprising:
   forming a molded structure by stacking interlayer insulating layers alternately with sacrificial layers on a plate layer;
   forming channel holes passing through the molded structure;
   forming channel layers doped with non-conductive impurities in the channel holes;
   forming a metal layer covering the channel holes;
   forming metal silicide layers on upper ends of the channel layers using the metal layer;
   crystallizing the channel layers using the metal silicide layers by performing a heat treatment process at a temperature of at least 800 degrees Celsius;
   forming openings penetrating through the molded structure and extending in one direction;
   removing the sacrificial layers exposed through the openings; and
   forming gate electrodes by filling regions from which the sacrificial layers have been removed, with a conductive material,
   wherein after the crystallizing, the metal silicide layers are located lower than a lowermost gate electrode among the gate electrodes.

2. The method of claim 1, wherein in the forming of the channel layers, the non-conductive impurities comprise at least one from among oxygen (O), carbon (C), and nitrogen (N).

3. The method of claim 1, wherein in the forming of the channel layers, the non-conductive impurities are doped in a concentration ranging from about $5 \times 10^{20}/cm^3$ to about $5 \times 10^{21}/cm^3$.

4. The method of claim 1, wherein the forming of the channel layers comprises depositing the channel layers by co-flowing a silicon source gas and a doping source gas containing the non-conductive impurities.

5. The method of claim 4, wherein the silicon source gas comprises at least one from among monosilane ($SiH_4$), disilane ($Si_2H_6$), trisilane ($Si_3H_8$), and dichlorosilane ($SiH_2Cl_2$), and the doping source gas comprises at least one from among nitrous oxide ($N_2O$), ethylene ($C_2H_4$), and ammonia ($NH_3$).

6. The method of claim 1, wherein in the crystallizing of the channel layers, the heat treatment process is performed at a temperature of about 800 degrees Celsius to about 1000 degrees Celsius.

7. The method of claim 1, wherein in the crystallizing of the channel layers, the heat treatment process is performed for about 10 seconds to about 3 minutes.

8. The method of claim 1, wherein in the crystallizing of the channel layers, the heat treatment process is performed by rapid thermal processing (RTP) or a laser annealing process.

9. The method of claim 1, wherein in the crystallizing of the channel layers, the heat treatment process is performed on one plate layer without being simultaneously performed on another plate layer.

10. The method of claim 1, wherein after the crystallizing of the channel layers, the channel layers have a single crystal or a single crystal-like structure.

11. The method of claim 1, further comprising:
before the forming of the molded structure, sequentially forming a horizontal sacrificial layer and an upper conductive layer on the plate layer; and
after the forming of the openings, removing the horizontal sacrificial layer and forming a lower conductive layer in a region from which the horizontal sacrificial layer has been removed.

12. The method of claim 11, wherein after the crystallizing, the metal silicide layers are positioned lower than an upper surface of the upper conductive layer.

13. The method of claim 1, wherein the metal silicide layers comprise at least one from among nickel silicide ($NiSi_2$), titanium silicide ($TiSi_2$), cobalt silicide ($CoSi_2$), tungsten silicide ($WSi_2$), platinum silicide ($PtSi_2$), and palladium silicide ($PdSi_2$).

14. The method of claim 1, wherein after the crystallizing, the metal silicide layers are positioned in each of the channel layers.

15. A method of manufacturing a semiconductor device, comprising:
forming a molded structure by stacking interlayer insulating layers alternately with sacrificial layers on a plate layer;
forming channel holes passing through the molded structure;
forming channel layers in the channel holes;

forming metal silicide layers on upper ends of the channel layers;
crystallizing the channel layers by metal induced lateral crystallization (MILC) using the metal silicide layers;
forming openings penetrating through the molded structure and extending in one direction;
removing the sacrificial layers exposed through the openings; and
forming gate electrodes by filling regions from which the sacrificial layers have been removed with a conductive material,
wherein the forming of the channel layers comprises supplying a semiconductor source gas and a doping source gas comprising non-conductive impurities, and
wherein after the crystallizing of the channel layers, the metal silicide layers are positioned in or on lower ends of the channel layers.

16. The method of claim 15, wherein the channel layers are formed without being doped with conductive impurities.

17. The method of claim 15, wherein the crystallizing of the channel layers is performed at a temperature of about at least 800 degrees Celsius.

18. A method of manufacturing a semiconductor device, comprising:
forming a molded structure by stacking interlayer insulating layers alternately with sacrificial layers on a plate layer;
forming channel holes passing through the molded structure;
forming first regions of channel structures comprising channel layers in the channel holes;
forming a metal layer covering the channel structures;
forming metal silicide layers on upper ends of the channel layers using the metal layer;
crystallizing the channel layers using the metal silicide layers;
forming second regions of the channel structures in the channel holes;
forming openings penetrating through the molded structure and extending in one direction; and
removing the sacrificial layers exposed through the openings and forming gate electrodes,
wherein the forming of the first regions of the channel structures comprises:
forming channel dielectric layers on inner sidewalls of the channel holes;
forming, on the channel dielectric layers, the channel layers comprising a semiconductor material doped with non-conductive impurities before the crystallizing the channel layers using the metal silicide layers; and
forming a channel filling layer inside the channel layers, and
wherein the forming of the second regions of the channel structures comprises forming channel pads comprising a semiconductor material doped with conductive impurities on upper ends of the channel holes.

19. The method of claim 18, wherein after the forming of the gate electrodes, at least one of an upper region and a lower region of the channel layers further comprises conductive impurities diffused from an outside of the channel layers.

* * * * *